(12) United States Patent
Jung

(10) Patent No.: US 8,373,666 B2
(45) Date of Patent: Feb. 12, 2013

(54) MOBILE TERMINAL USING PROXIMITY SENSOR AND CONTROL METHOD THEREOF

(75) Inventor: Jang Jae Jung, Seoul (KR)

(73) Assignee: LG Electronics Inc., Seoul (KR)

(*) Notice: Subject to any disclaimer, the term of this patent is extended or adjusted under 35 U.S.C. 154(b) by 750 days.

(21) Appl. No.: 12/260,952

(22) Filed: Oct. 29, 2008

(65) Prior Publication Data

US 2009/0251423 A1 Oct. 8, 2009

(30) Foreign Application Priority Data

Apr. 4, 2008 (KR) .................... 10-2008-0031788

(51) Int. Cl.
*G06F 3/041* (2006.01)

(52) U.S. Cl. ......... 345/173; 345/156; 345/594; 715/700

(58) Field of Classification Search ........... 345/156–178
See application file for complete search history.

(56) References Cited

U.S. PATENT DOCUMENTS

| | | | | |
|---|---|---|---|---|
| 5,686,940 A * | 11/1997 | Kuga | ............................ | 345/156 |
| 7,049,998 B1 * | 5/2006 | Frady et al. | ..................... | 342/52 |
| 7,852,325 B2 * | 12/2010 | Fu et al. | ........................ | 345/174 |
| 7,956,847 B2 * | 6/2011 | Christie | ........................ | 345/173 |
| 2003/0063187 A1 * | 4/2003 | Pagano et al. | .................... | 348/61 |
| 2005/0129385 A1 * | 6/2005 | Speasl et al. | ..................... | 386/46 |
| 2005/0275626 A1 * | 12/2005 | Mueller et al. | ................ | 345/156 |
| 2006/0097991 A1 * | 5/2006 | Hotelling et al. | ............. | 345/173 |
| 2006/0197753 A1 * | 9/2006 | Hotelling | ...................... | 345/173 |
| 2007/0247515 A1 * | 10/2007 | Roman | ...................... | 348/14.02 |
| 2008/0109729 A1 * | 5/2008 | Notea et al. | .................... | 715/722 |
| 2008/0155413 A1 * | 6/2008 | Ubillos | ......................... | 715/716 |
| 2008/0165141 A1 * | 7/2008 | Christie | ........................ | 345/173 |
| 2008/0165157 A1 * | 7/2008 | Fu et al. | ......................... | 345/174 |
| 2008/0219672 A1 * | 9/2008 | Tam et al. | ..................... | 398/130 |
| 2008/0253737 A1 * | 10/2008 | Kimura et al. | ................. | 386/68 |
| 2009/0082061 A1 * | 3/2009 | Roh et al. | .................... | 455/556.1 |
| 2009/0121889 A1 * | 5/2009 | Lin et al. | .................... | 340/686.6 |
| 2009/0140986 A1 * | 6/2009 | Karkkainen et al. | .......... | 345/173 |
| 2009/0153501 A1 * | 6/2009 | Schultz et al. | ................ | 345/173 |

* cited by examiner

*Primary Examiner* — Amare Mengistu
*Assistant Examiner* — Sarvesh J Nadkarni
(74) *Attorney, Agent, or Firm* — Lee, Hong, Degerman, Kang & Waimey

(57) ABSTRACT

The present invention relates to a mobile terminal using a proximity sensor and a control method thereof. According to the control method of a mobile terminal, a moving image screen in which a moving image is played is displayed on a touch screen and the play speed of the moving image is controlled based on a proximity signal detected by the proximity sensor. Further, when a touch signal is input through the touch screen, a moving image screen is captured and a capture image is created. According to the present invention, various screen controls can be performed using the proximity sensor.

16 Claims, 24 Drawing Sheets

MOBILE TERMINAL USING PROXIMITY SENSOR AND CONTROL METHOD THEREOF

CROSS-REFERENCE TO RELATED APPLICATIONS

Pursuant to 35 U.S.C. §119, this application claims the benefit of earlier filing date and right of priority to Korean Application No. 10-2008-0031788, filed on Apr. 4, 2008, the contents of which are hereby incorporated by reference herein in their entirety.

FIELD OF THE INVENTION

The present invention relates to a mobile terminal which enables various screen controls by employing a proximity sensor, and a method of controlling the mobile terminal.

BACKGROUND OF THE INVENTION

A mobile terminal is a portable device equipped with at least one of a function for performing a voice call and video call while being portable, a function for inputting and outputting information, a function for storing data, etc. As the functions of the mobile terminal diversify, the mobile terminal has been equipped with complicated functions, such as still and moving image capture, music file play, moving image file play, game play, broadcast reception, and wireless Internet. Notably, a mobile terminal implementing one or more of these functions may be considered a comprehensive multimedia player.

In the mobile terminal/comprehensive multimedia player, a variety of attempts have been made to implement complicated functions from a hardware or software viewpoint. For example, attempts have been made to modify a user interface environment to allow a user to search and/or select functions easily and conveniently. Further, because the mobile terminal is considered a personal belonging for expressing a user's personality, various fashionable design changes have been attempted, such as a double-faced liquid crystal display (LCD) or a full touch screen.

However, a mobile terminal has limited space allocation with regard to a user interface, such as a display and keypad. This is mostly because mobility, portability, etc. of the terminal must be taken into consideration. Accordingly, to efficiently use various functions provided in a mobile terminal, it is necessary to control an operation of the mobile terminal via a new entry method instead of the existing menu method.

SUMMARY OF THE INVENTION

Accordingly, an embodiment of the present invention is directed to provide a mobile terminal, which can perform various screen controls using a proximity sensor capable of detecting proximity objects, and a control method thereof.

Additional features and advantages of the invention will be set forth in the description which follows, and in part will be apparent from the description, or may be learned by practice of the invention. The objectives and other advantages of the invention will be realized and attained by the structure particularly pointed out in the written description and claims hereof as well as the appended drawings.

To achieve these and other advantages and in accordance with the purpose of the present invention, as embodied and broadly described, the present invention is embodied in a mobile terminal comprising a touchscreen for displaying a moving image, a proximity sensor for sensing an object in near-proximity to the touchscreen, and a controller for controlling a play speed of the moving image according to a state of the object in near-proximity to the touchscreen, wherein the controller captures an image frame of the moving image when the object contacts the touchscreen while the image frame is displayed.

In accordance with another embodiment of the present invention, a mobile terminal comprises a touchscreen for displaying a moving image, a proximity sensor for sensing an object in near-proximity to the touchscreen, and a controller for controlling a play speed of the moving image according to a state of the object in near-proximity to the touchscreen, wherein the controller stops movement of the moving image when the object contacts the touchscreen.

In one aspect of the invention, the controller incrementally moves the image according to a movement of the object along the touchscreen while contacting the touchscreen. In another aspect of the invention, the controller captures an image frame of the moving image according to a movement of the object along the touchscreen while contacting the touchscreen. Alternatively, the controller captures an image frame of the moving image and facilitates transmission of the captured image according to a movement of the object along the touchscreen while contacting the touchscreen.

In a further aspect of the invention, the controller displays a plurality of image frames of the moving image when the object contacts the touchscreen, wherein the plurality of image frames comprise at least one of an image frame previously displayed, an image frame currently displayed, and an image frame to be displayed when the moving image restarts movement.

In accordance with another embodiment of the present invention, a mobile terminal comprises a touchscreen for displaying a moving image, a proximity sensor for sensing an object in near-proximity to the touchscreen, and a controller for controlling a play speed of the moving image according to a state of the object in near-proximity to the touchscreen, wherein the controller provides a screen capture menu on the touchscreen when the object contacts the touchscreen.

In one aspect of the invention, the screen capture menu comprises at least one of a function for capturing a current image frame, a function for displaying a plurality of image frames of the moving image, and a function for capturing a plurality of image frames of the moving image.

In another aspect of the invention, the controller provides a selection menu on the touchscreen according to a state of the object in near-proximity to the touchscreen, the selection menu comprising at least one of a function for continuing to watch a current broadcast, a function for watching a stored broadcast, and a function for ending broadcast watching. Preferably, the screen capture menu is provided on the touchscreen via a pop-up window.

In accordance with another embodiment of the present invention, a method for controlling a mobile terminal comprises displaying a moving image on a touchscreen, sensing an object in near-proximity to the touchscreen, controlling a play speed of the moving image according to a state of the object in near-proximity to the touchscreen, and capturing an image frame of the moving image when the object contacts the touchscreen while the image frame is displayed.

In accordance with another embodiment of the present invention, a method for controlling a mobile terminal comprises displaying a moving image on a touchscreen, sensing an object in near-proximity to the touchscreen, controlling a play speed of the moving image according to a state of the object in near-proximity to the touchscreen, and stopping movement of the moving image when the object contacts the touchscreen.

In one aspect of the invention, the method further comprises incrementally moving the image according to a movement of the object along the touchscreen while contacting the touchscreen.

In another aspect of the invention, the method further comprises capturing an image frame of the moving image according to a movement of the object along the touchscreen while contacting the touchscreen. Alternatively, the method further comprises capturing an image frame of the moving image and facilitating transmission of the captured image according to a movement of the object along the touchscreen while contacting the touchscreen.

In a further aspect of the invention, the method further comprises displaying a plurality of image frames of the moving image when the object contacts the touchscreen, wherein the plurality of image frames comprise at least one of an image frame previously displayed, an image frame currently displayed, and an image frame to be displayed when the moving image restarts movement.

In accordance with another embodiment of the present invention, a method for controlling a mobile terminal comprises displaying a moving image on a touchscreen, sensing an object in near-proximity to the touchscreen, controlling a play speed of the moving image according to a state of the object in near-proximity to the touchscreen, and providing a screen capture menu on the touchscreen when the object contacts the touchscreen.

In one aspect of the invention, the screen capture menu comprises at least one of a function for capturing a current image frame, a function for displaying a plurality of image frames of the moving image, and a function for capturing a plurality of image frames of the moving image.

In another aspect of the invention, the method further comprises providing a selection menu on the touchscreen according to a state of the object in near-proximity to the touchscreen, the selection menu comprising at least one of a function for continuing to watch a current broadcast, a function for watching a stored broadcast, and a function for ending broadcast watching. Preferably, the screen capture menu is provided on the touchscreen via a pop-up window.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate embodiments of the invention and together with the description serve to explain the principles of the invention. Features, elements, and aspects of the invention that are referenced by the same numerals in different figures represent the same, equivalent, or similar features, elements, or aspects in accordance with one or more embodiments.

DETAILED DESCRIPTION OF THE PREFERRED EMBODIMENTS

The present invention will now be described in detail in connection with specific embodiments with reference to the accompanying drawings.

A mobile terminal described in this specification can include a mobile phone, a smart phone, a notebook computer, a device for digital broadcasting, a personal digital assistant (PDA), a portable multimedia player (PMP), a navigation device, and so on.

Figure 1:
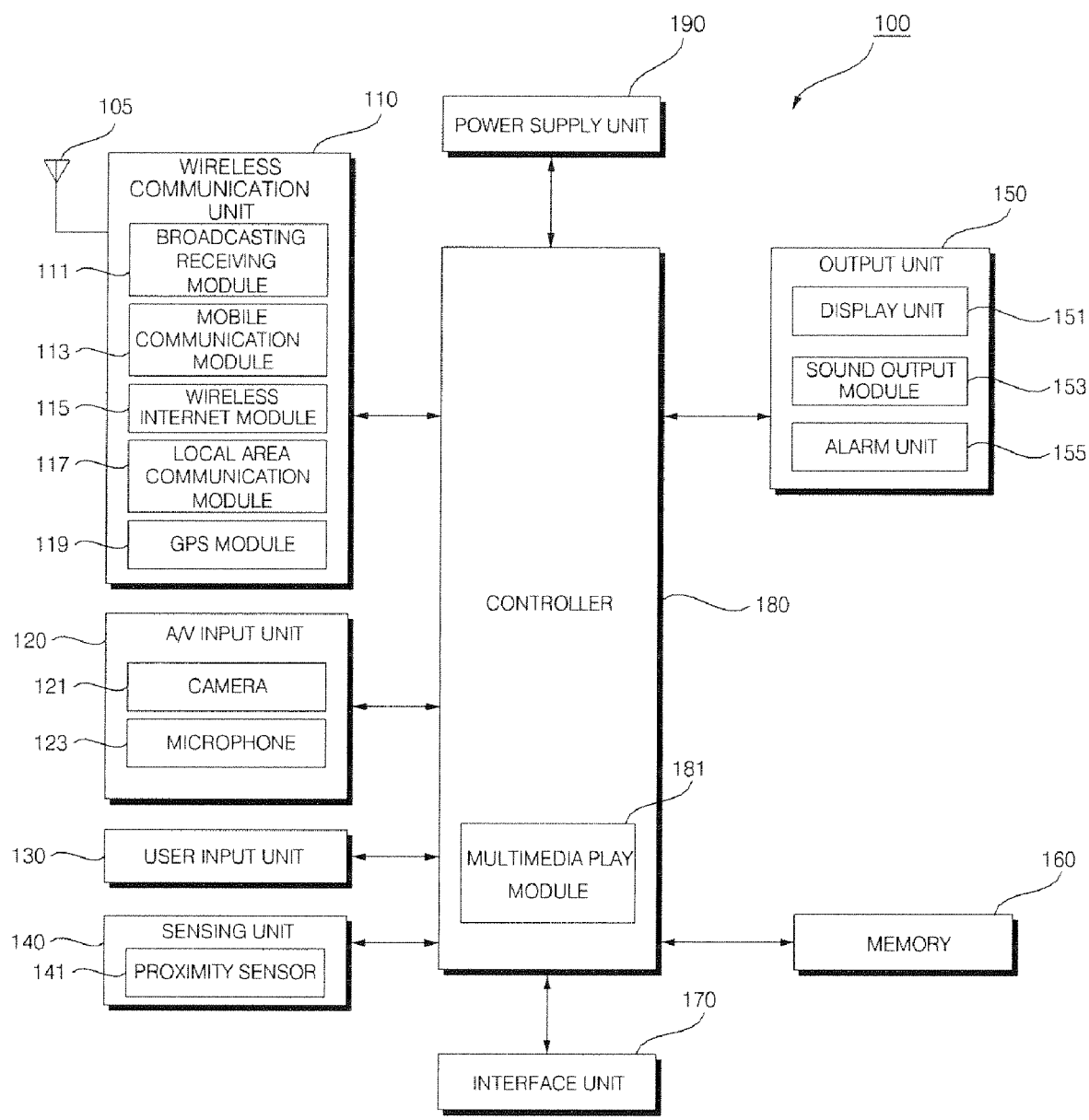
FIG. 1 is a block diagram of a mobile terminal in accordance with an embodiment of the present invention.

FIG. 1 is a diagram showing the construction of a mobile terminal in accordance with an embodiment of the present invention. The mobile terminal in accordance with an embodiment of the present invention is described with reference to FIG. 1 from a viewpoint of constituent elements according to functions.

Referring to FIG. 1, a mobile terminal 100 can include a wireless communication unit 110, an audio/video (A/V) input unit 120, a user input unit 130, a sensing unit 140, an output unit 150, memory 160, an interface unit 170, a controller 180, and a power supply unit 190. Here, when the above constituent elements are implemented actually, two or more of the constituent elements may be combined into one constituent element or one constituent element may be divided into two or more constituent elements, if appropriate.

The wireless communication unit 110 can include a broadcasting receiving module 111, a mobile communication module 113, a wireless Internet module 115, a local area communication module 117, a global positioning system (GPS) module 119, and so on.

The broadcasting receiving module 111 receives at least one of broadcasting signals and broadcasting-pertinent information from an external broadcasting management server over a broadcasting channel. The broadcasting channel may include a satellite channel, a terrestrial wave channel and the like. The broadcasting management server may refer to a server that generates and sends at least one of broadcasting signals and broadcasting-related information, or a server which receives at least one of previously generated broadcasting signals and previously generated broadcasting-related information and transmits it to a device.

The broadcasting-related information may refer to information pertinent to broadcasting channels, broadcasting programs and/or broadcasting service providers. The broadcasting signals may include not only TV broadcasting signals, radio broadcasting signals, and data broadcasting signals, but also broadcasting signals in which TV broadcasting signals or radio broadcasting signals are combined with data broadcasting signals. The broadcasting-related information can be provided over a mobile communication network. In this case, the broadcasting-related information can be received by the mobile communication module 113. The broadcasting-related information may exist in various forms. For example, the broadcasting-related information may exist in the form of an electronic program guide (EPG) of digital multimedia broadcasting (DMB), an electronic service guide (ESG) of digital video broadcast-handheld (DVB-H) or the like.

The broadcasting receiving module 111 receives broadcasting signals by employing various broadcasting systems. In particular, the broadcasting receiving module 111 can receive broadcasting signals using digital broadcasting systems such as digital multimedia broadcasting-terrestrial (DMB-T), digital multimedia broadcasting-satellite (DMB-S), media forward link only (MediaFLO), digital video broadcast-handheld (DVB-H), and integrated services digital broadcast-terrestrial (ISDB-T). Further, the broadcasting receiving module 111 can be configured to be suitable for not only the above digital broadcasting systems, but also all broadcasting systems that provide broadcasting signals. The broadcasting signals and/or broadcasting-related information received through the broadcasting receiving module 111 can be stored in the memory 160.

The mobile communication module 113 transmits or receives radio signals to or from at least one of a base station, an external terminal, and a server over a mobile communication network. Here, the radio signals may include various forms of data according to the transmission/reception of voice call signals, video call signals, or text/multimedia messages.

The wireless Internet module 115 refers to a module for wireless Internet access. The wireless Internet module 115 may be embedded in the mobile terminal 100 or disposed externally to the mobile terminal 100. The local area communication module 117 refers to a module for local area communication. Local area communication technologies may include Bluetooth, radio frequency identification (RFID), infrared data association (IrDA), ultra wideband (UWB), Zig-Bee, and so on. The GPS module 119 receives position information from a plurality of GPS satellites.

The A/V input unit 120 is for the input of audio signals or video signals and can include a camera 121, a microphone 123, and so on. The camera 121 processes image frames such as a still image or a moving image, which are detected by an image sensor in a video call mode or capturing mode. The processed image frames can be displayed on a display unit 151.

The image frames processed in the camera 121 can be stored in the memory 160 or transmitted to the outside through the wireless communication unit 110. The camera 121 may be provided in plural numbers according to a configuration aspect of a device.

The microphone 123 receives external sound signals in a call mode, a recording mode, a voice recognition mode, and so on and converts the sound signals into electrical sound data. In the call mode, the processed sound data can be converted into a format, which can be transmitted to a mobile communication base station through the mobile communication module 113 and then output. The microphone 123 may employ a variety of noise removal algorithms for removing noise occurring in the process of receiving external sound signals.

The user input unit 130 generates key input data, which is input by a user in order to control the operation of the device. The user input unit 130 may include the keypad, the dome switch, the touch pad (static pressure/constant electricity), the jog wheel, the jog switch, the finger mouse or the like. In particular, a mutual layer structure of the touch pad and the display unit 151 may be referred to as a touch screen.

The sensing unit 140 senses a current state of the mobile terminal 100, such as a closed state of the mobile terminal 100, the position of the mobile terminal 100, whether a user is touched, etc. and generates a sensing signal to control the operation of the mobile terminal 100. For example, when the mobile terminal 100 is a slide phone, the sensing unit 140 can sense whether the slide phone is opened or not. The sensing unit 140 also has a function of sensing whether power is supplied to the power supply unit 190, whether the interface unit 170 is connected to an external device, and so on.

The sensing unit 140 can include a proximity sensor 141. The proximity sensor 141 can detect an approaching object or whether objects exist nearby without mechanical contact. The proximity sensor 141 can detect adjacent objects by employing a change of AC magnetic field, a change of static magnetic field, the rate of capacitance or the like. Two or more proximity sensor 141 may be provided according to the aspect of a configuration.

The output unit 150 is configured to output audio signals, video signals and alarm signals, and can include the display unit 151, a sound output module 153, an alarm unit 155, and so on.

The display unit 151 displays thereon information processed in the mobile terminal 100. For example, when the mobile terminal is in the call mode, the display unit 151 can display user interface (UI) or graphic user interface (GUI) pertinent to a call. When the mobile terminal 100 is in the video call mode or capturing mode, the display unit 151 can display captured or received images thereon and can also display UI or GUI thereon.

Meanwhile, in the event that the display unit 151 and the touch pad form a layer structure in order to constitute a touch screen as described above, the display unit 151 may also be used as an input device as well as an output device. When the display unit 151 is constructed of a touch screen, it can include a touch screen panel, a touch screen panel controller, and so on. In this case, the touch screen panel is a transparent panel attached to the outside and can be connected to an internal bus of the mobile terminal 100. The touch screen panel transmits a corresponding signal to the touch screen panel controller when there is a touch input. The touch screen panel controller processes the corresponding signal received from the touch screen panel and transmits corresponding data to the controller 180. Accordingly, the controller 180 can know whether there is a touch input or which region of the touch screen has been touched.

Further, the display unit 151 can include at least one of a liquid crystal display, a thin film transistor-liquid crystal display, an organic light-emitting diode, a flexible display, and a 3D display. Two or more display units 151 may exist according to the type where the mobile terminal 100 is implemented. For example, the mobile terminal 100 can be equipped with an external display unit (not shown) and an internal display unit (not shown) at the same time.

The sound output module 153 outputs audio data, which is received from the wireless communication unit 110 in an incoming call mode, a call mode, a record mode, a voice recognition mode, an incoming broadcasting mode, and so on, or stored in the memory 160. The sound output module 153 also outputs sound signals pertinent to functions, such as sound of an incoming call signal and sound of an incoming message, which are performed in the mobile terminal 100. The sound output module 153 can include a speaker, a buzzer or the like.

The alarm unit 155 outputs signals to inform events generated in the mobile terminal 100. For example, the events occurring in the mobile terminal 100 can include a received call signal, a received message, a key signal input and the like. The alarm unit 155 can also output signals to inform the occurrence of events in different ways in addition to the audio signals or the video signals. For example, the alarm unit 155 can output signals in vibration form. When a call signal is received or a message is received, the alarm unit 155 can output vibration in order to inform the reception of the call signal or message. Alternatively, when a key signal is input, the alarm unit 155 can output vibration as a feedback to the input key signal. A user can notice the occurrence of an event through this vibration. It is to be understood that the signals to inform the occurrence of events can also be output through the display unit 151 and/or the sound output module 153.

The memory 160 can store programs necessary to process and control the controller 180 and also temporarily store input or output data (for example, a phonebook, a message, a still image, a moving image and the like).

The memory 160 can include a storage medium, such as a flash memory type, a hard disk type, a multimedia card micro type, memory of a card type (for example SD or XD memory, and so on), RAM, and ROM. The mobile terminal 100 can also manage a web storage that performs the storage function of the memory 160 on the Internet.

The interface unit 170 functions as an interface with all external devices connected to the mobile terminal 100. For example, the external devices connected to the mobile terminal 100 can include wired/wireless headsets, an external charger, wired/wireless data ports, a memory card, a card socket such as subscriber identification module (SIM)/user identity module (UIM) cards, an audio input/output (I/O) terminal, a video I/O terminal, an earphone, and so on. The interface unit 170 can receive data from the external devices, can be supplied with power, can transfer the received data to respective constituent elements within the mobile terminal 100, and can transmit data within the mobile terminal 100 to the external devices.

The controller 180 generally controls the operation of each element in order to control an overall operation of the mobile terminal 100. For example, the controller 180 can perform pertinent controls and processes for voice call, data communication, video call, and so on. The controller 180 can be equipped with a multimedia play module 181 for playing multimedia. The multimedia play module 181 may be constructed in hardware within the controller 180 or in software separately from the controller 180.

The power supply unit 190 is supplied with external power or internal power, and supplies power necessary for the operation of each constituent element to the constituent elements under the control of the controller 180.

The mobile terminal pertinent to the present invention has been described so far from a viewpoint of the constituent elements according to their functions. Hereinafter, the mobile terminal related to the present invention is described from a viewpoint of the constituent elements according to their external forms with reference to FIGS. 2 and 3. Of several types of mobile terminals including the folding type, the bar type, the swing type, and the sliding type, the sliding type mobile terminal equipped with a full touch screen is now described as an example for convenience of description. However, it is to be understood that the present invention is not limited to the sliding type mobile terminal, but instead can be applied to all types of mobile terminals including the above types.

Figure 2:
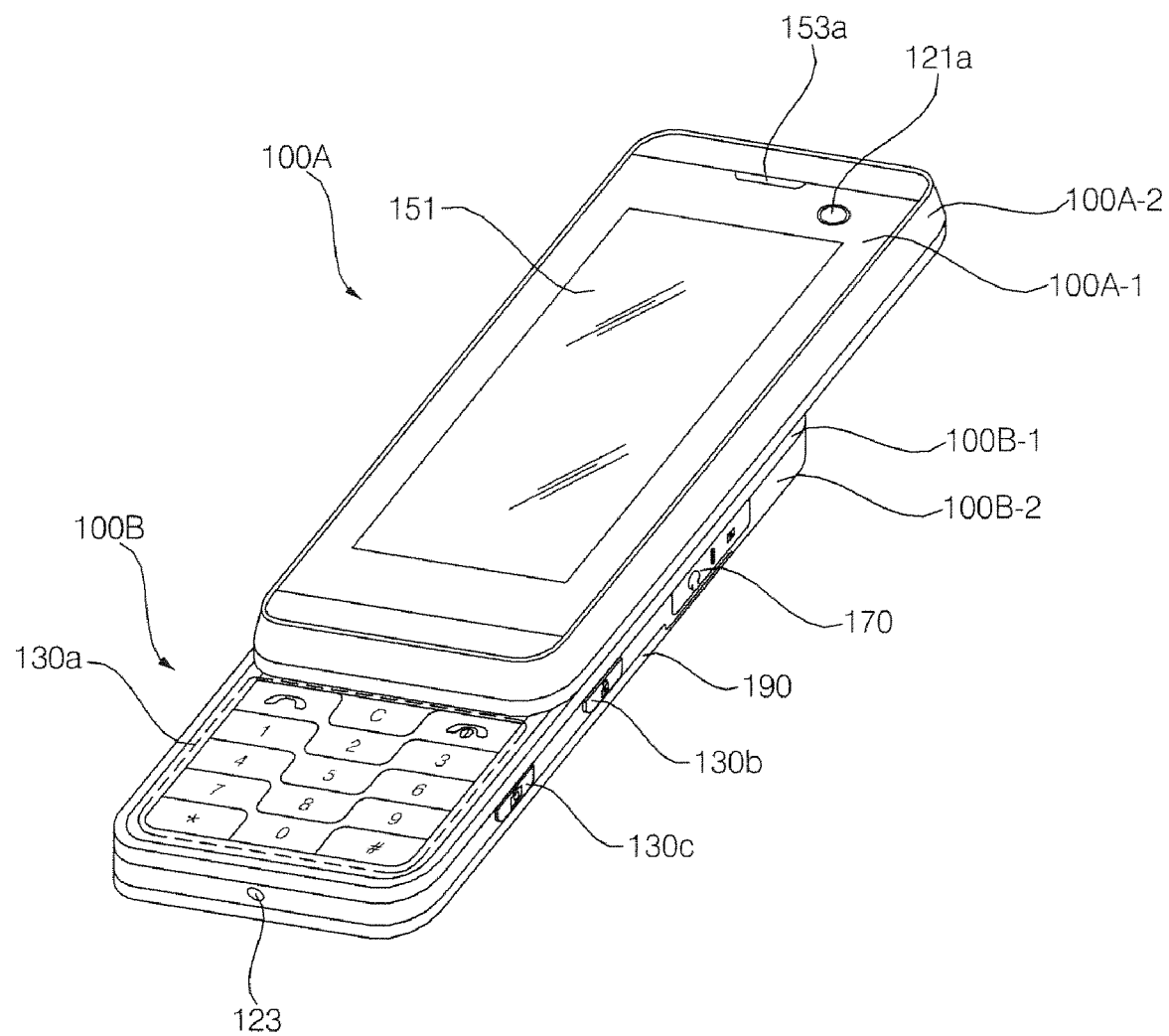
FIG. 2 is a front perspective view of the mobile terminal in accordance with an embodiment of the present invention.

FIG. 2 is a front perspective view of the mobile terminal in accordance with an embodiment of the present invention. Referring to FIG. 2, the mobile terminal includes a first body 100A, and a second body 100B that can slide along at least one direction of the first body 100A.

A state where the first body 100A is overlapped with the second body 100B may be called a closed configuration, and a state where at least part of the second body 100B is exposed through the first body 100A as shown in FIG. 2 may be called an open configuration.

In the configuration where the mobile terminal 100 is closed, the mobile terminal 100 generally operates in a standby mode, but the standby mode may be released through manipulation by a user. In the configuration where the mobile terminal 100 is opened, the mobile terminal 100 generally operates in the call mode or the like, but the call mode may be switched to the standby mode through manipulation by a user or after a lapse of a certain time period.

A casing constituting an external shape of the first body 100A is comprised of a first front casing 100A-1 and a first rear casing 100A-2. A variety of electronic components are built in a space formed by the first front casing 100A-1 and the first rear casing 100A-2. At least one intermediate casing may be disposed between the first front casing 100A-1 and the first rear casing 100A-2. The casings can be formed by injecting synthetic resin or can be formed from metal such as STS or Ti.

The display unit 151, a first sound output module 153a, and a first camera 121a can be disposed in the first body 100A, more particularly, in the first front casing 100A-1.

The display unit 151 includes a LCD, an OLED, etc. for visually displaying information. A touch pad can be overlapped with the display unit 151 in a layer structure, so that the display unit 151 can operate as a touch screen and enables the input of information through a user's touch. The first sound output module 153a can be implemented using a receiver or speaker. The first camera 121a can be constructed to capture images or moving images of a user, and so on.

In the same manner as the first body 100A, a casing constituting an external shape of the second body 100B includes a second front casing 100B-1 and a second rear casing 100B-

2. A first user input unit 130*a* may be disposed in the second body 100B, more particularly, on a front face of the second front casing 100B-1. Second and third user input units 130*b* and 130*c*, the microphone 123, and the interface unit 170 may be disposed in at least one of the second front casing 100B-1 and the second rear casing 100B-2.

The first to third user input units 130*a*, 130*b*, and 130*c* can be collectively called the user input unit 130. The user input unit 130 may adopt any kind of a method as long as it supports a tactile manner.

For example, the user input unit 130 can be implemented using a dome switch or a touch pad, which is able to receive commands or information by a user's push or touch manipulation, or can be implemented in a wheel or jog manner, or a manipulation manner using a joystick.

In terms of a function, the first user input unit 130*a* is adapted to input commands such as start, end, and scroll, numbers, texts, symbols, and so on. The second and third user input units 130*b* and 130*c* can be used as hot keys for activating special functions within the mobile terminal.

The microphone 123 can be implemented in an adequate fashion, which is suitable to receive a user's voice, other sound, and so on. The interface unit 170 becomes a passage through which the mobile terminal in accordance with the present invention can exchange data with external devices. For example, the interface unit 170 can be at least one of a connector for connecting to an earphone in a wired or wireless manner, a port for local area communication, and a power supply terminal for supplying power to the mobile terminal 100. The interface unit 170 may be a card socket for receiving an external card, such as SIM, UIM and a memory card for storing information.

The power supply unit 190 for supplying power to the mobile terminal is disposed on the part of the second rear casing 100B-2. The power supply unit 190 can be, for example, a rechargeable battery, and can be detachably attached to the second body 100B for the purpose of recharging, etc.

Figure 3:
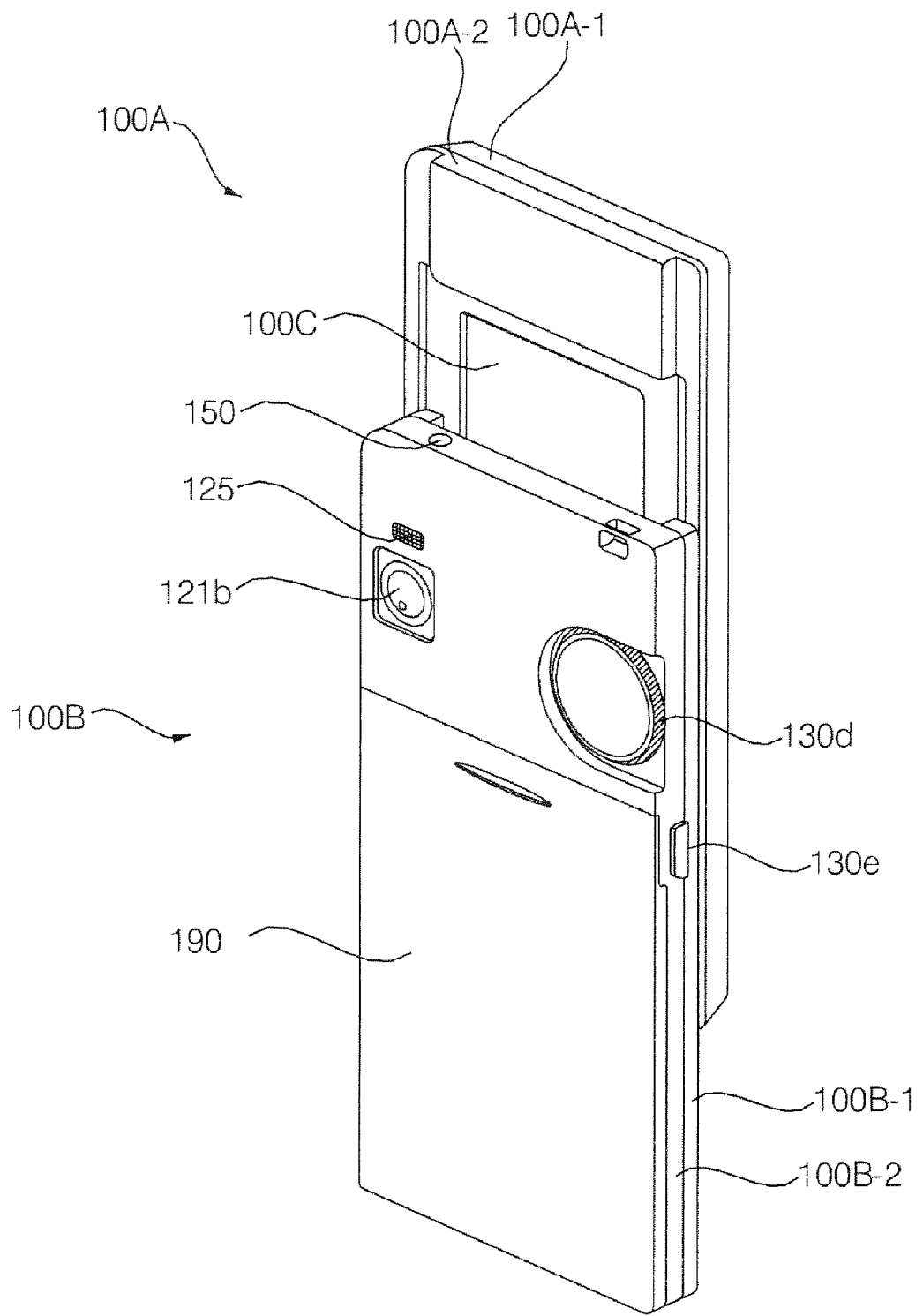
FIG. 3 is a rear perspective view of the mobile terminal in accordance with an embodiment of the present invention.

FIG. 3 is a rear perspective view of the mobile terminal shown in FIG. 2. Referring to FIG. 3, a fourth user input unit 130*d* of a wheel type and a second camera 121*b* may be additionally mounted on a rear face of the second rear casing 100B-2 of the second body 100B. A fifth user input unit 130*e* may be disposed on a lateral face of the second body 100B.

The second camera 121*b* has a photographing direction, which is substantially opposite to that of the first camera 121*a*, and can have different pixels from that of the first camera 121*a*. For example, the first camera 121*a* may have low pixels sufficient to photograph a user's face and send the photographed face to a counterpart in the video call or the like. The second camera 121*b* may have high pixels because photographed subjects may not be transmitted immediately after the photographing, for example.

A flash 125 and a mirror (not shown) can be further disposed adjacent to the second camera 121*b*. The flash 125 is configured to illuminate a subject when the subject is photographed using the second camera 121*b*. The mirror is configured to reflect a user when the user has his face, etc. photographed (self-photographing) using the second camera 121*b*.

A second sound output module (not shown) may be further disposed in the second rear casing 100B-2. The second sound output module can realize a stereo function together with the first sound output module 153*a* and can also be used for a call in the speakerphone mode.

An antenna (not shown) for receiving broadcasting signals as well as an antenna for a call, and so on may be disposed on one side of the second rear casing 100B-2. The antenna 105 can be drawn out from the second body 100B. A part of a sliding module that slidingly couples the first body 100A and the second body 100B can be disposed on the part of the first rear casing 100A-2 of the first body 100A. The other part of the sliding module can be disposed on the part of the second front casing 100B-1 of the second body 100B, so it may not be exposed to the outside, as shown in FIG. 3.

It has been described above that the second camera 121*b* and the like are disposed in the second body 100B. However, the present invention is not limited to the above arrangement. For example, one or more of the constituent elements, which are disposed in the second rear casing 100B-2 together with the second camera 121*b*, etc., may be disposed in the first body 100A, mainly, in the first rear casing 100A-2. Hence, there is an advantage in that the constituent elements disposed in the first rear casing 100A-2 are protected by the second body 100B in the closed configuration. Further, although the second camera 121*b* is not separately included, the first camera 121*a* may be disposed rotatably in such a way to photograph even the photographing direction of the second camera 121*b*.

The power supply unit 190 for supplying power to the mobile terminal is disposed on the part of the second rear casing 100B-2. The power supply unit 190 may be, for example, a rechargeable battery, and can be detachably attached to the rear casing 100A-2 for recharging, and so on.

It has been described above that the second camera 121*b*, and so on are disposed in the rear casing 100A-2, but the present invention is not limited to the above configuration.

Figure 4:
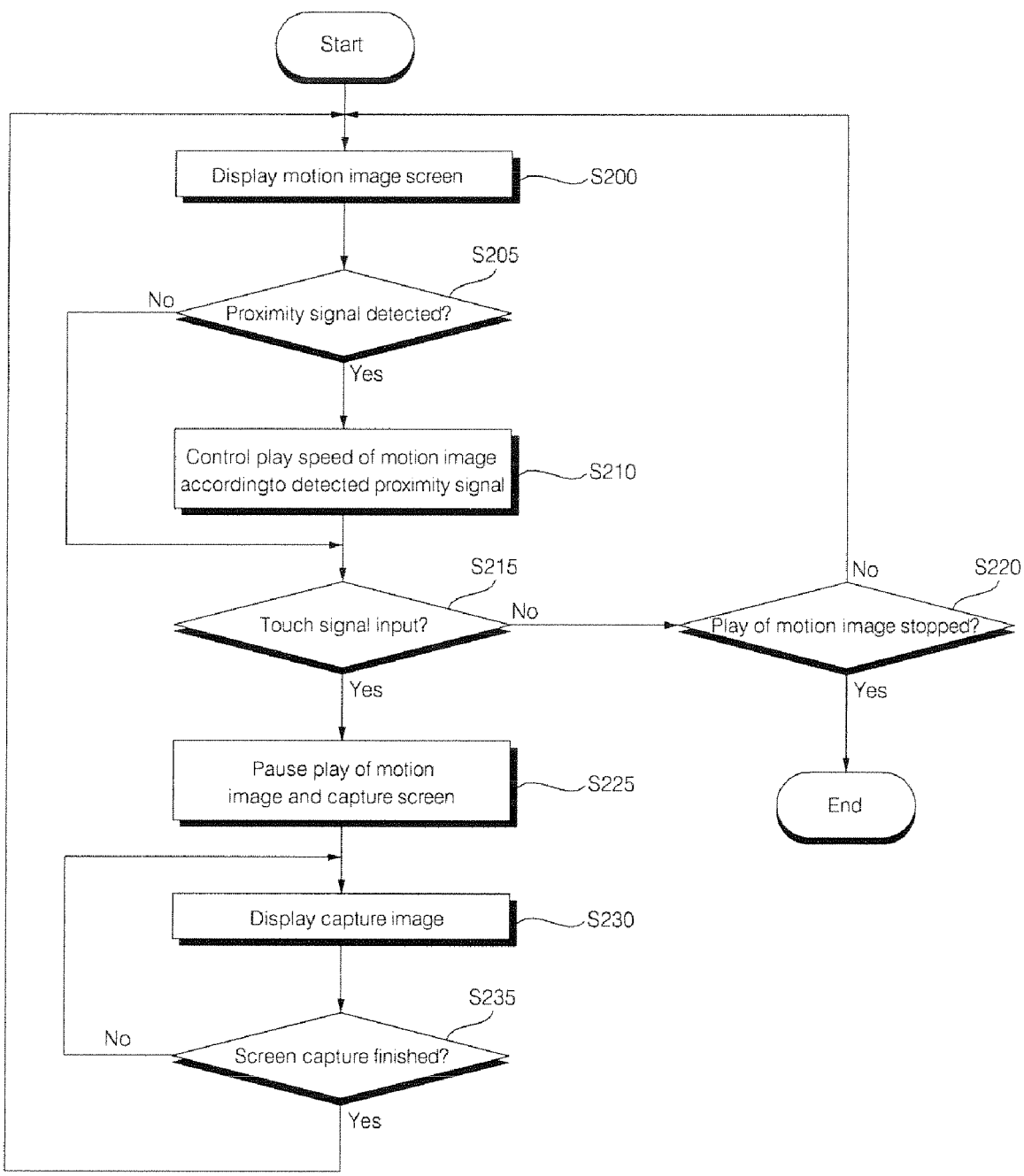
FIG. 4 is a flowchart illustrating a method of controlling a mobile terminal according to a first embodiment of the present invention.

FIG. 4 is a flowchart describing a control method of a mobile terminal in accordance with a first embodiment of the present invention.

Referring to FIG. 4, if a moving image (for example, multimedia file) play menu is entered according to a user command and a moving image file to be played is selected, the controller 180 controls a moving image screen on which the selected moving image file is played to be displayed on the display unit 151, such as a touch screen, at step S200.

The controller 180 determines whether a proximity signal is detected by the proximity sensor 141, while displaying the moving image screen, at step S205. If, as a result of the determination, a proximity signal, which is generated when a user's finger, stylus, pointer, etc. approaches the display unit 151 and is detected by a neighboring proximity sensor 141, the controller 180 controls the play speed of the moving image according to the detected proximity signal at step S210. Here, the controller 180 may control the play speed of the moving image to be slow when the proximity degree is close according to the detected proximity signal. Alternatively, the controller 180 may control the play speed of the moving image to be fast when the proximity degree is close according to use environment.

After the proximity signal is detected and therefore the play speed of the moving image is controlled to be slow or fast, if the user's finger or the like becomes distant from the proximity sensor and therefore the proximity signal is not detected, the moving image can be reproduced at its original play speed. Further, when the play speed of the moving image becomes slow or fast according to the detected proximity signal, an indicator icon, indicating that a current play speed of the moving image is slower or faster than a normal speed, may be displayed on the display unit 151. At the same time, an icon, indicating that an approaching object has been detected, an icon indicating the proximity degree of a detected proximity object, and so on may also be displayed on the display unit 151.

While the play speed of the moving image is controlled according to the proximity signal as described above, it is determined whether a touch signal has been input through the display unit 151 at step S215. If, as a result of the determination, the touch signal has been input, the controller 180 pauses the play of the moving image and captures a touched screen at step S225. A capture image is created through such screen capturing. The created capture image is assigned a file name by the controller 180 and then stored in a setting region of the memory 160. At this time, when a touch signal is input, the play of the moving image may be paused and a menu for selecting whether screen capturing will be performed may be displayed, according to use environment. Alternatively, after screen capturing is completed, a message, informing that the capturing has been completed, may be displayed.

Next, the controller 180 displays the capture image on the display unit 151 and then determines whether a screen capture end has been selected at step S235. If, as a result of the determination, the screen capturing end has been selected, the controller 180 restarts the paused play of the moving image again and displays the moving image on the display unit 151 at step S200. If, as a result of the determination at step S215, the touch signal has not been input, the controller 180 continues to perform the processes (S220, S200) of playing the moving image and displaying a moving image screen on the display unit 151 until the play of the moving image is paused.

Through this process, the play speed of a moving image can become slow by approaching the user's finger, etc. to a moving image screen, which is being played rapidly, and a capture image can be created by touching a desired screen. Alternatively, in order for operations other than screen capturing to be executed according to a touch signal, other operations may be performed when the boundary region of a moving image screen is touched and an operation pertinent to screen capturing may be performed only when the central region of the screen is touched. For example, when a touch signal is input through the boundary region of a moving image screen or a region on which a moving image screen is not displayed in the display unit 151, the play of the moving image may be paused or menus pertinent to screen control, and so on may be displayed.

Figure 5:
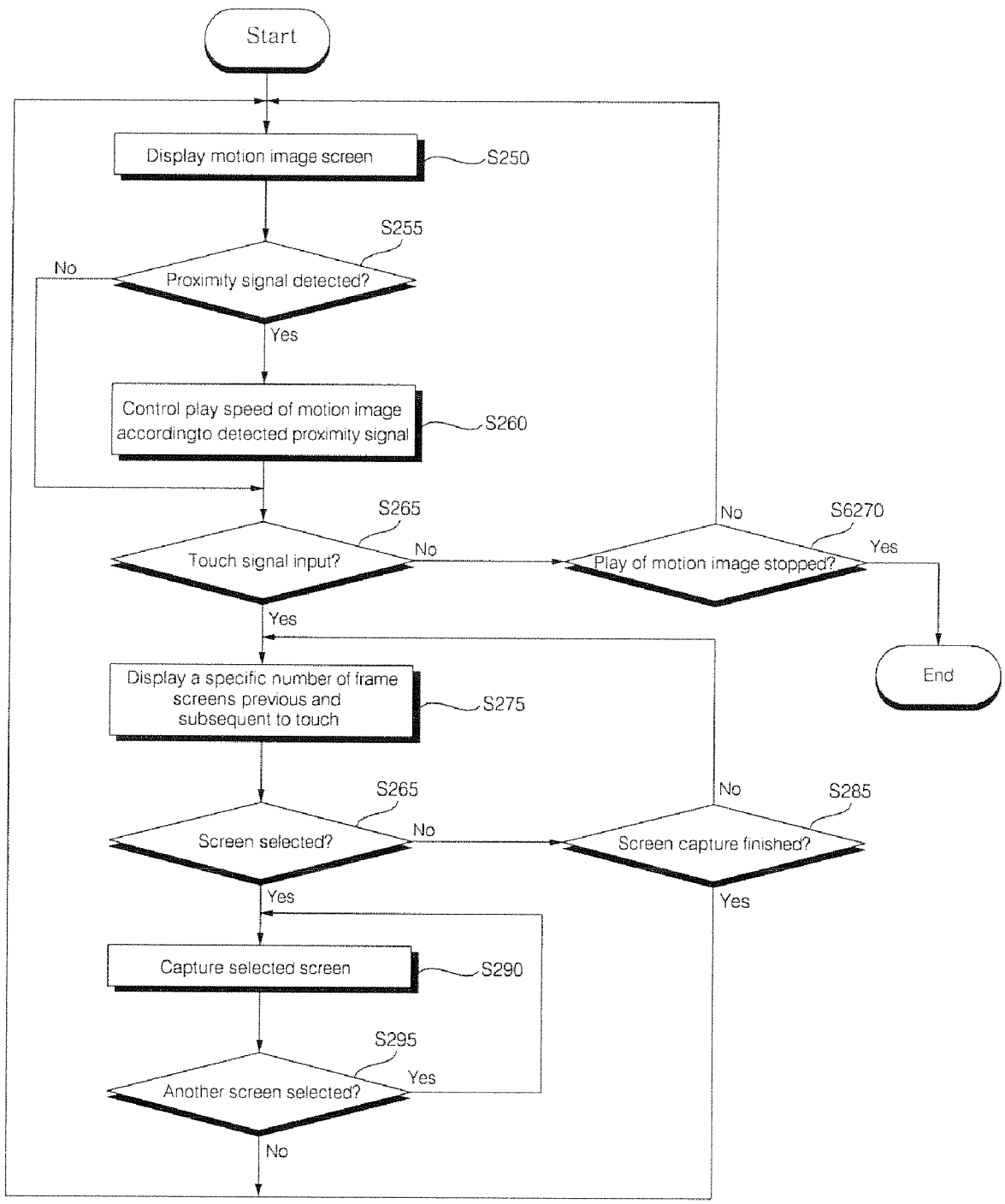
FIG. 5 is a flowchart illustrating a method of controlling a mobile terminal according to a second embodiment of the present invention.

FIG. 5 is a flowchart describing a control method of a mobile terminal in accordance with a second embodiment of the present invention. In the present embodiment, processes (S250 to S270) of playing a selected moving image file, displaying a moving image screen, and controlling the play speed of the moving image according to a detected proximity signal until the play of the moving image is stopped are identical to those of the above embodiment. Accordingly, description of the processes will be omitted for simplicity.

According to the present embodiment, it is determined whether a touch signal has been input through the display unit 151 while the play speed of a moving image is controlled according to a proximity signal. If the touch signal has been input, the controller 180 pauses the play of the moving image and then controls a specific number of frame screens, which are before or after a touched screen, to be displayed on the display unit 151 at step S275. At this time, the number of the frame screens displayed on the display unit 151 may be changed according to a user command and the like, and a specific number of the frame screens may be displayed as an image in thumbnail form.

It is then determined whether any one of the frame screens displayed on the display unit 151 has been selected through a touch input or the like at step S280. If, as a result of the determination, any one of the frame screens displayed on the display unit 151 has been selected, the controller 180 captures a selected screen at step S290. A capture image is created through such screen capturing. The created capture image is assigned a file name by the controller 180 and then stored in a setting area of the memory 160. Here, a message, informing that the capture image has been created and stored, may be displayed.

Next, it is determined whether another of the frame screens displayed on the display unit 151 has been selected at step S295. If, as a result of the determination, another frame screen has been selected, the controller 180 repeatedly performs the process (S290) of capturing a selected screen. However, if any one of the frame screens displayed on the display unit 151 is selected at steps S280 and S295, it is determined whether a screen capture end has been selected at step S285. If, as a result of the determination, the screen capture end has been selected, the controller 180 returns to the process (S250) where a moving image is played and a moving image screen is displayed.

Through this process, a user can capture a touched screen, and a desired screen before or after a touched screen, which is selected from frame screens.

Figure 6A:
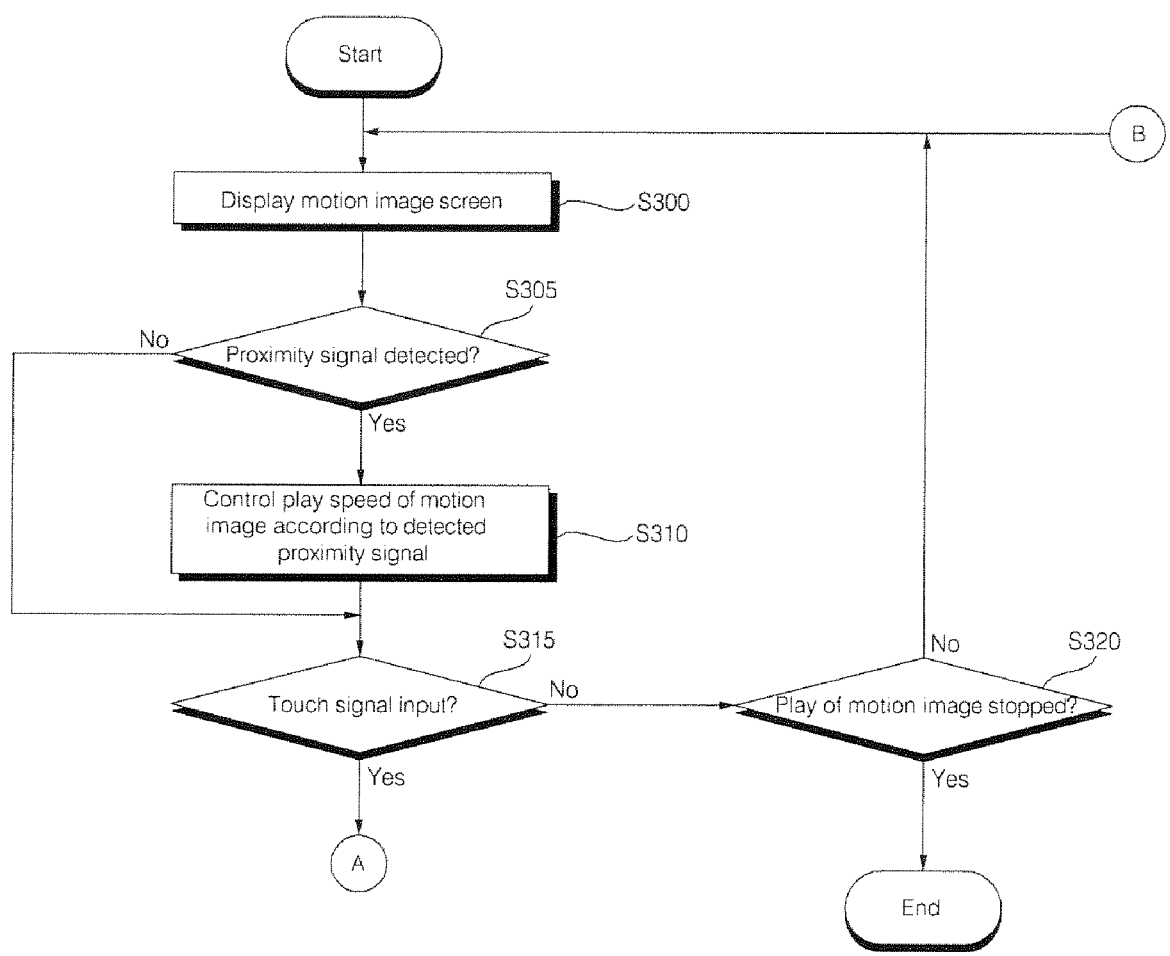
FIGS. 6A and 6B are flowcharts illustrating a method of controlling a mobile terminal according to a third embodiment of the present invention.
Figure 6B:
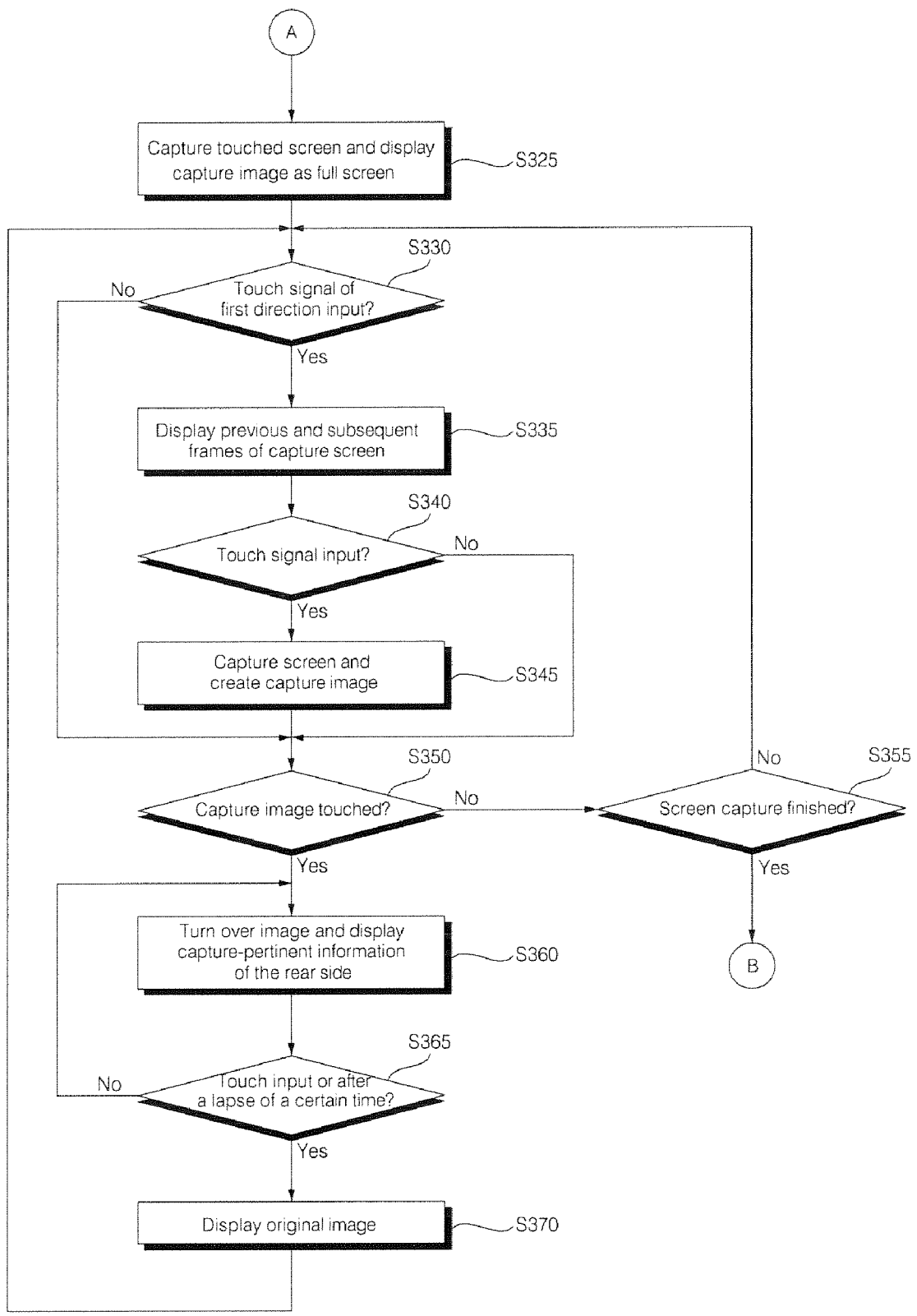

FIGS. 6A and 6B are flowcharts describing a control method of a mobile terminal in accordance with a third embodiment of the present invention. In the present embodiment, processes (S300 to S320) of playing a selected moving image file, displaying a moving image screen, and controlling the play speed of the moving image according to a detected proximity signal until the play of the moving image is stopped are identical to those of the above embodiments. Accordingly, description of the processes will be omitted for simplicity.

According to the present embodiment, it is determined whether a touch signal has been input through the display unit 151, while the play speed of a moving image is controlled according to a proximity signal. If the touch signal has been input, the controller 180 captures a touched screen, creates a capture image, and displays the created capture image on the display unit 151 as a full screen at step S325. Here, the capture image may be stored in a preset area as a preset file name and menus for allowing a user to select a file name and a storage area of a capture image may be displayed. When a capture image is stored, capturing-pertinent information is stored together.

It is then determined whether a touch and drag signal having left and right directions, or a touch signal having a first direction, such as a touch flick signal having left and right directions, including an operation of drawing on the surface of the touch screen by a user's finger, etc., is input at step S330. If, as a result of the determination, the touch and drag signal and the touch signal is input, the controller 180 displays a previous frame screen or a subsequent frame screen on the display unit 151 in a direction indicated by the touch signal by using the capture image as a current frame screen at step S335.

For example, when a touch signal with left directivity is input, a frame screen before the current frame can be displayed, and when a touch signal with right directivity is input, a frame screen after the current frame can be displayed. In this case, a frame screen right before or after the current frame may be displayed, or a frame screen several frame screens before or several frame screens after the current frame may be displayed according to setting.

Next, it is determined whether a touch signal has been input through the display unit 151 in a state where the frame screen before or after the capture image is displayed at step S340. If, as a result of the determination, the touch signal has been input, the controller 180 captures a touched frame screen and creates a capture image at step S345. It is then determined whether the capture image has been touched again at step S350. If, as a result of the determination, the capture image has been touched again, the controller 180 turns over the capture image and controls capture-pertinent information of the back side to be displayed at step S360. The capture-pertinent information can include a file size and a created date of a selected capture image, information related to a captured moving image, and so on.

It is then determined whether the back side of the capture image has been touched again or a specific time has elapsed without a touch input at step S365, the controller 180 controls an original capture image before the turn-over to be displayed at step S370 and then returns to the process (S330). However, if, as a result of the determination at step S350, the capture image has not been touched, it is determined whether a screen capture end has been selected at step S355. If, as a result of the determination, the screen capture end has been selected, the controller 180 returns to the process (S300) where the moving image is continuously played and the moving image screen is displayed.

Through this process, a desired screen of frame screens previous and subsequent to a touched screen can be captured and a capture image can be created. Further, although the left and right directions has been described as the first direction in the present embodiment, the direction of a touch signal, which can display a frame screen previous and subsequent to a touched screen, can be arbitrarily set according to a user command or the like.

Figure 7A:
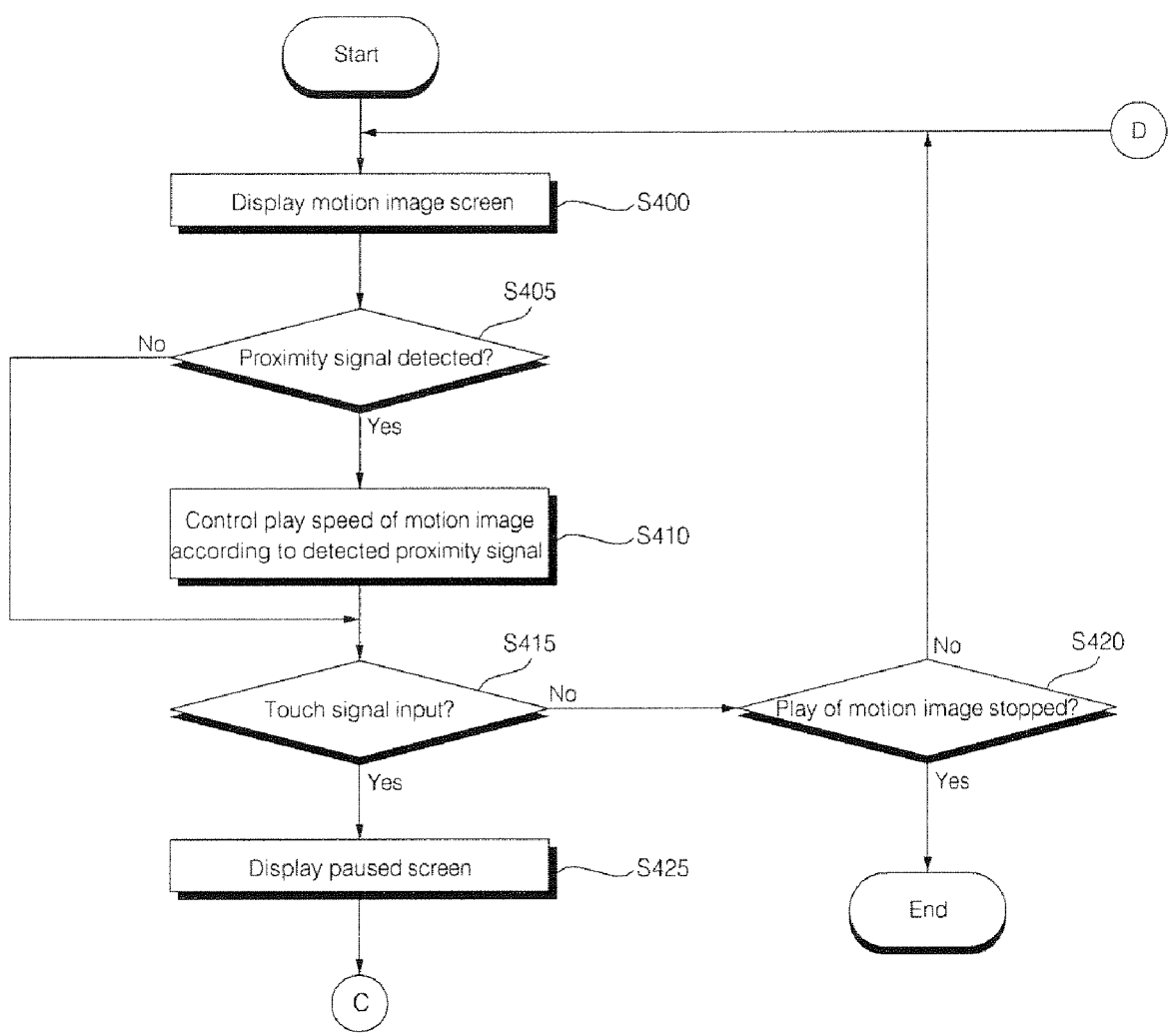
FIGS. 7A and 7B are flowcharts illustrating a method of controlling a mobile terminal according to a fourth embodiment of the present invention.
Figure 7B:
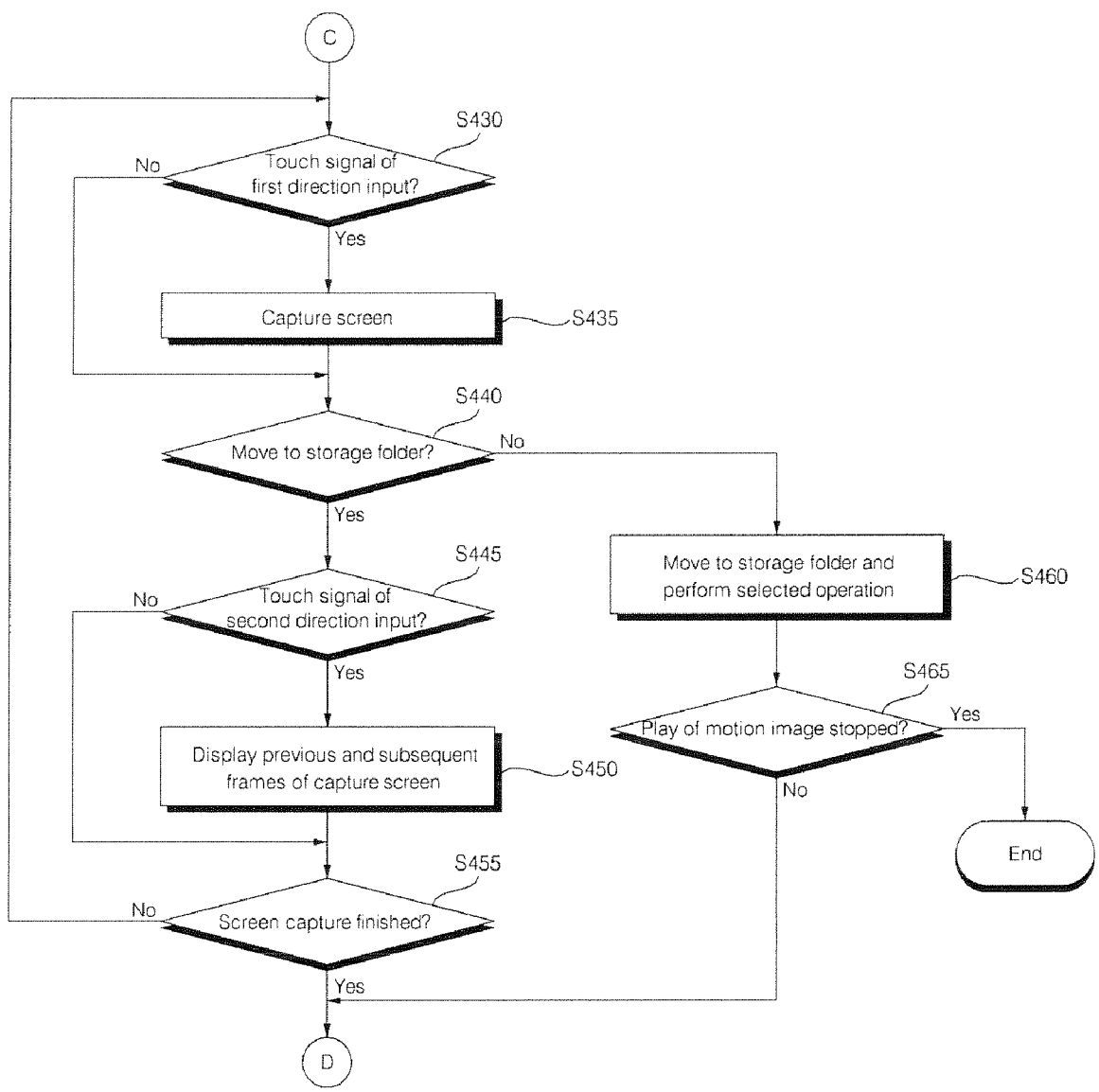

FIGS. 7A and 7B are flowcharts describing a control method of a mobile terminal in accordance with a fourth embodiment of the present invention. In the present embodiment, processes (S400 to S420) of playing a selected moving image file, displaying a moving image screen, and controlling the play speed of the moving image according to a detected proximity signal until the play of the moving image is stopped are identical to those of the above embodiments. Accordingly, description of the processes will be omitted for simplicity.

According to the present embodiment, it is determined whether a touch signal has been input through the display unit 151 while the play speed of a moving image is controlled according to a proximity signal. If the touch signal has been input, the controller 180 pauses the play of the moving image and controls a paused screen to be displayed at step S425.

It is then determined whether a touch signal of a first direction, such as the up and down directions, has been input at step S430. If, as a result of the determination, the touch signal has been input, the controller 180 captures a touched screen and creates a capture image at step S435, and then displays a menu for selecting whether to move the created capture image to a capture image storage folder at step S440. If, as a result of the determination, the menu for moving the created capture image to the storage folder has been selected, the controller 180 moves the created capture image to a preset storage folder and controls a selected operation to be executed at step S460. Thereafter, if a moving image play stop is selected, the play of the moving image is stopped, but if the moving image play stop is not selected, the controller 180 continues to play the moving image at step S465.

If, as a result of the determination at step S440, the menu for moving the created capture image to the storage folder has not been selected, the controller 180 controls the displayed menu to disappear and then determines whether a touch signal of a second direction, such as the left and right directions different from the first direction, has been input at step S445. If, as a result of the determination, the touch signal of the second direction has been input, the controller 180 controls a frame screen before or after the paused screen to be displayed on the display unit 151 at step S450. It is then determined whether a screen capture end has been selected at step S455. If, as a result of the determination, the screen capture end has not been selected, the controller 180 returns to the process (S430).

Figure 8A:
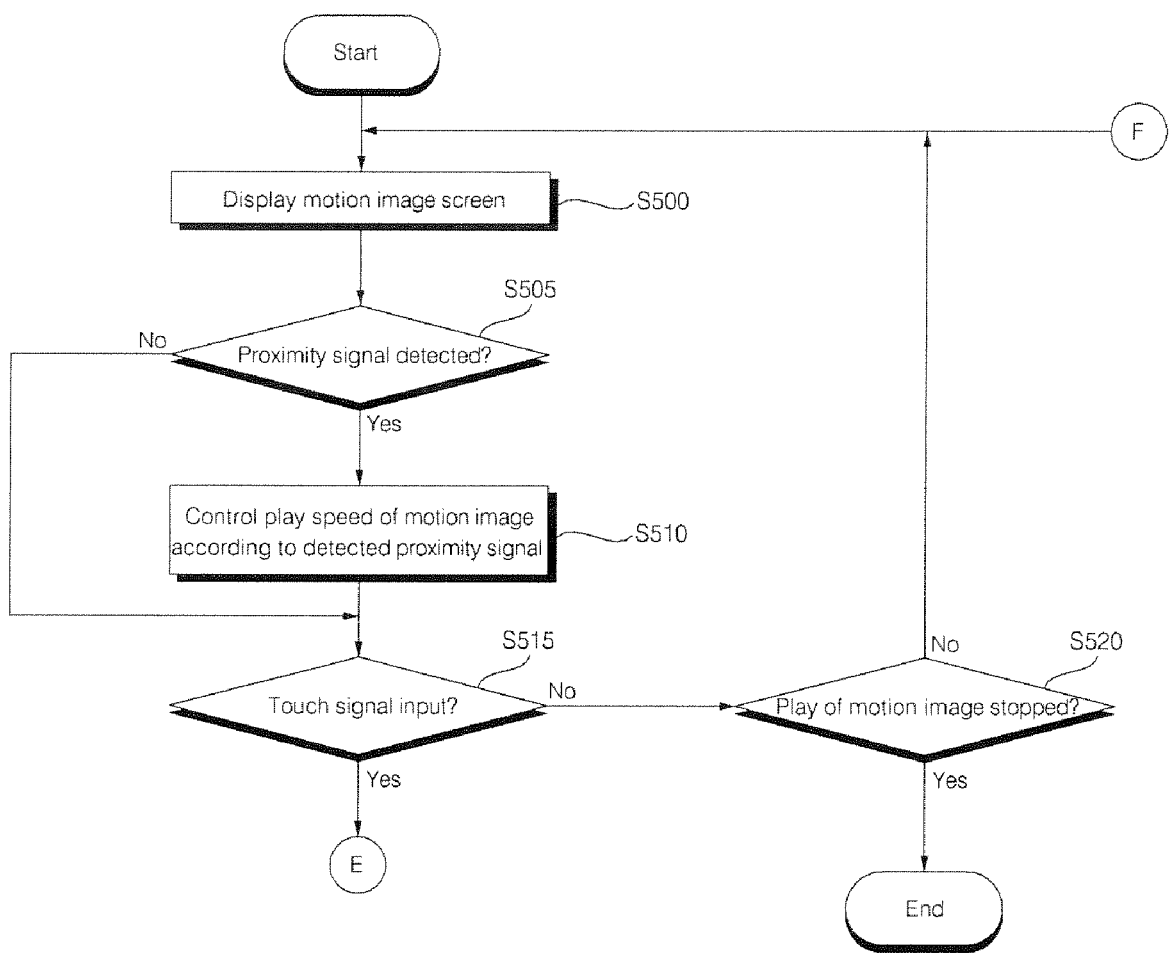
FIGS. 8A and 8B are flowcharts illustrating a method of controlling a mobile terminal according to a fifth embodiment of the present invention.
Figure 8B:
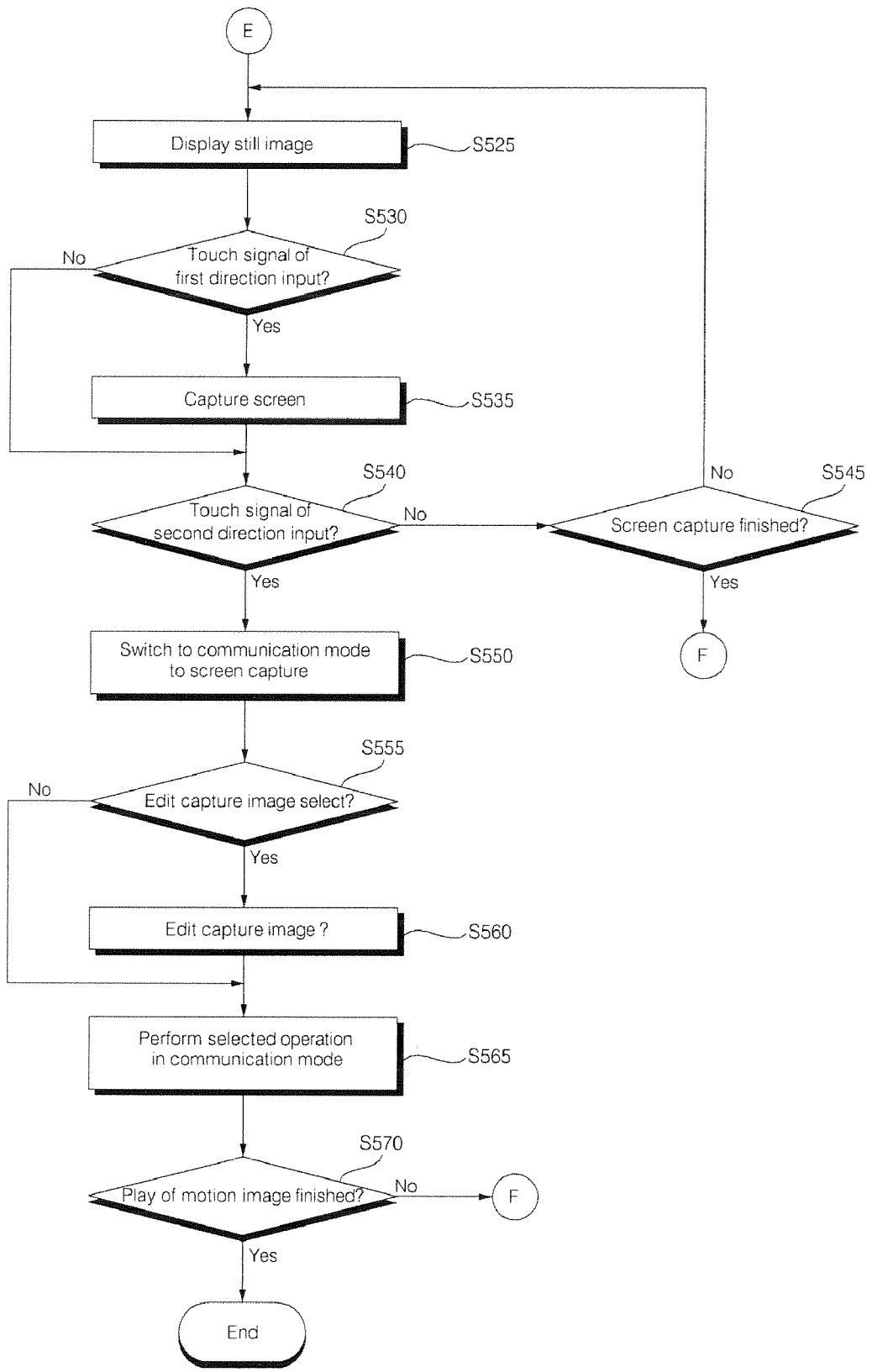

FIGS. 8A and 8B are flowcharts describing a control method of a mobile terminal in accordance with a fifth embodiment of the present invention. In the present embodiment, processes (S500 to S520) of playing a selected moving image file, displaying a moving image screen, and controlling the play speed of the moving image according to a detected proximity signal until the play of the moving image is stopped are identical to those of the above embodiments.

According to the present embodiment, it is determined whether a touch signal has been input through the display unit 151 at step S515, while the play speed of a moving image is controlled according to a proximity signal. If the touch signal has been input, the controller 180 pauses the play of the moving image and displays a paused screen on the display unit 151 at step S525. It is then determined whether a touch signal of a first direction has been input at step S530. If, as a result of the determination, the touch signal of the first direction has been input, the controller 180 captures the paused screen and creates a capture image at step S535.

It is then determined whether a touch signal of a second direction has been input at step S540. If, as a result of the determination, the touch signal of the second direction has been input, the controller 180 captures a paused screen and controls a current mode to a communication mode at step S550. Here, the communication mode refers to a mode where communication, such as a voice call, a video call, reception/transmission of messages, and data communication, can be performed. It is then determined whether editing of the capture image has been selected in the communication mode at step S555. If, as a result of the determination, the editing of the capture image has been selected, the controller 180 provides a menu where the capture image can be edited at step S560.

Next, the controller 180 controls operations, which have been selected in the communication mode, to be executed at step S565. Examples of the operation selected in the communication mode may include an operation for transmitting a capture image, an operation for writing a message using a capture image as a background screen and sending the written image, an operation for transmitting a capture image as a substitution image upon a video call, and so on.

Thereafter, if the stop of the moving image play is selected, the play of the moving image is stopped, but if the stop of moving image play is not selected, the controller 180 continues to perform the process of playing the moving image and displaying the moving image screen at step S570.

Figure 9:
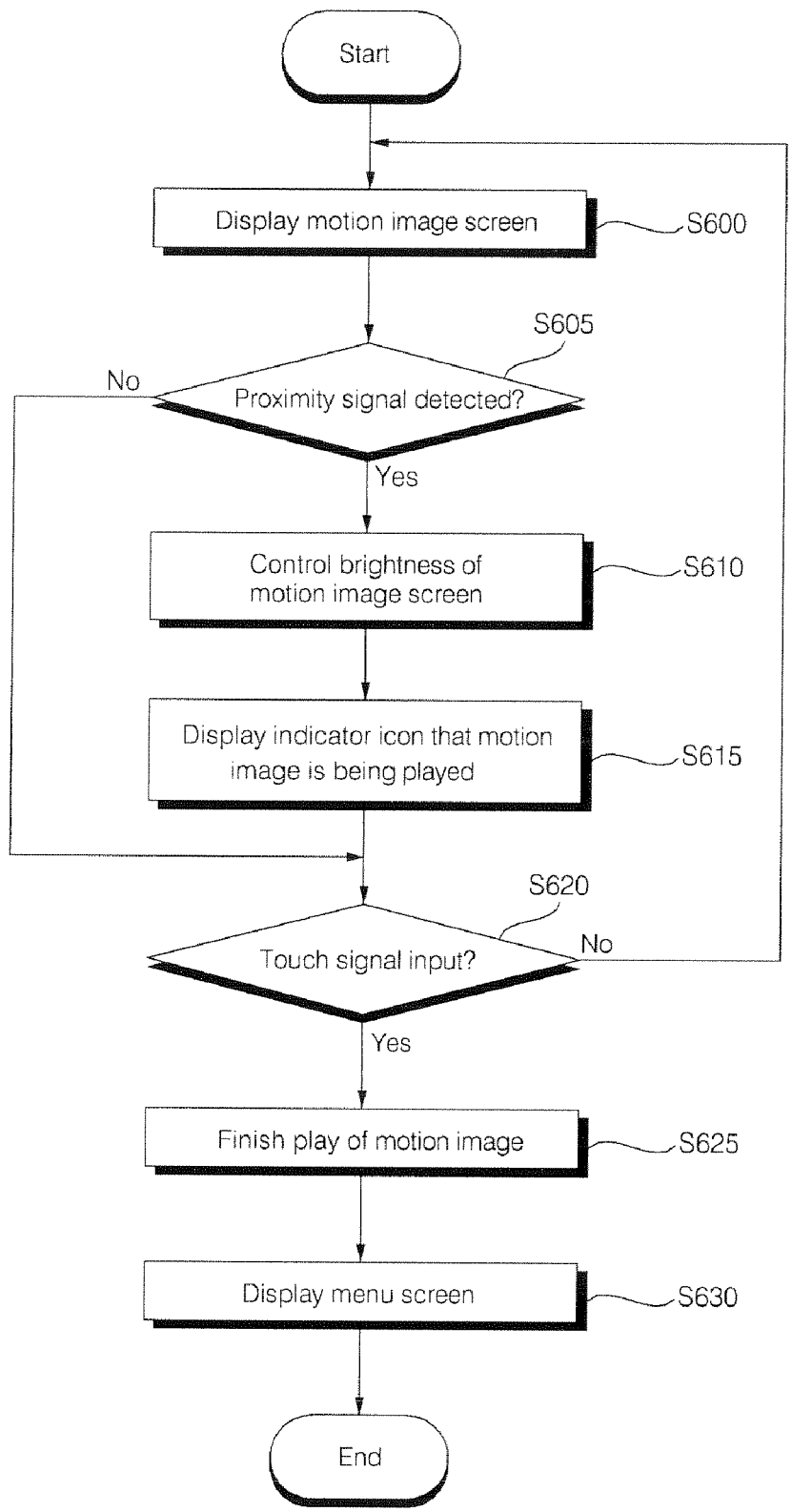
FIG. 9 is a flowchart illustrating a method of controlling a mobile terminal according to a sixth embodiment of the present invention.

FIG. 9 is a flowchart describing a control method of a mobile terminal in accordance with a sixth embodiment of the present invention. Referring to FIG. 9, if a moving image (for example, multimedia file) play menu is entered according to a user command and a moving image file to be played is selected, the controller 180 plays the selected moving image and controls a moving image screen to be displayed on the display unit 151, such as a touch screen, at step S600. The controller 180 determines whether a proximity signal has been detected by the proximity sensor and received therefrom, while displaying the moving image screen, at step S605.

If, as a result of the determination, a proximity signal, which is generated when for example a user's palm, etc. approaches the proximity sensor, has been received, the controller 180 controls the brightness of the moving image screen at step S610. Here, the proximity signal may be generated when a user's palm, having a wider detection area than that of the finger, approaches the proximity sensor. Further, the brightness of the moving image screen may be controlled to be dark to the extent that the contents of the screen cannot be recognized, or the moving image screen may be fully turned off.

However, when the moving image continues to play, the controller 180 displays an indicator icon, indicating that the moving image screen is being played at step S615. The indicator icon can be displayed on the display unit 151. Alternatively, a signal, indicating that the moving image screen is being played, may be represented using a variety of methods such as an on screen display (OSD) message, a specific key and a flickering signal of a lamp.

It is then determined whether, in a state where the brightness of the moving image screen is controlled according to the proximity signal, a touch signal has been input through the display unit 151 at step S620. The controller 180 stops the play of the moving image at step 525 and displays a menu screen at step S630. At this time, the displayed menu screen may be a menu, which is displayed in an idle state, a moving image control-related menu, a menu set by a user or the like.

In the above process, it has been described that when a proximity signal is detected, the brightness of a screen is controlled to be dark, and although a proximity signal is not detected, a controlled screen brightness is maintained. However, the brightness of a screen may be controlled only when a proximity signal is detected and the brightness of a screen may be controlled to have an original brightness when a proximity signal is not detected, according to use environment.

Figure 10:
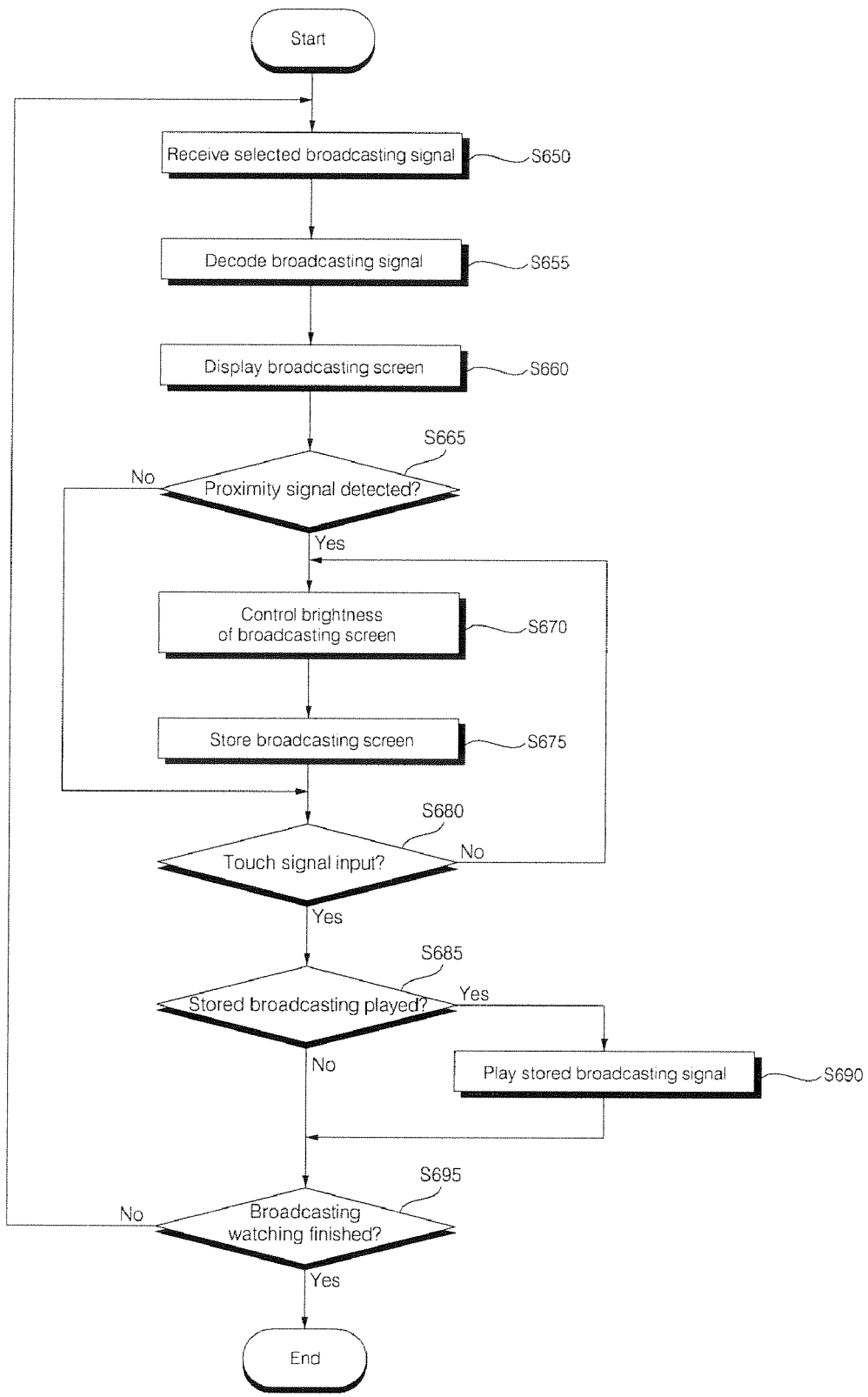
FIG. 10 is a flowchart illustrating a method of controlling a mobile terminal according to a seventh embodiment of the present invention.

FIG. 10 is a flowchart describing a control method of a mobile terminal in accordance with a seventh embodiment of the present invention. In the present embodiment, an example in which a screen is controlled according to a proximity signal when broadcasting is watched is described.

Referring to FIG. 10, a broadcasting signal, selected according to a user command, is received through the broadcasting receiving module 111 under the control of the controller 180 at step S650. The broadcasting receiving module 111 demodulates the received broadcasting signal and generates a transport stream. The generated transport stream is divided into element streams, such as video, audio, and data information, and then decoded, so reproducible broadcasting signals, such as audio and video signals and data information, can be generated every transport stream at step S665. The controller 180 displays the reproducible broadcasting signals on the display unit 151, so a broadcasting screen is displayed on the display unit 151 at step S660.

The controller 180 determines whether a proximity signal, which is generated when for example a user's palm, etc. approaches the proximity sensor, has been detected and received, while displaying the broadcasting screen, at step S665. If, as a result of the determination, the proximity signal has been received, the controller 180 controls the brightness of the broadcasting screen at step S670. Here, the brightness of the broadcasting screen may be controlled to be dark to the extent that the contents of the screen cannot be recognized, or the moving image screen may be fully turned off.

Next, the controller 180 controls the reproducible broadcasting signals, output from the broadcasting receiving module 111, to be stored in the memory 160 at step S675. At this time, the controller 180 may output a notice signal, such as an indicator icon, informing that the broadcasting screen is being stored.

It is then determined whether, in a state where the brightness of the broadcasting screen is controlled according to the proximity signal, a touch signal has been input through the display unit 151 at step S680. If, as a result of the determination, the touch signal has been input, it is determined whether the stored broadcasting will be played at step S685. If, as a result of the determination, the stored broadcasting will be played, the controller 180 controls the stored broadcasting signals to be played at step S690. Next, it is determined whether the stop of the broadcasting play has been selected at step S695. If, as a result of the determination, the stop of the broadcasting play has not been selected, the controller 180 returns to the process (S650) where a selected broadcasting signal is decoded and a broadcasting screen is displayed.

In the case of a mobile terminal having a timeshift function, the brightness of a screen can be controlled using the timeshift function in order to continuously play parts which have not been displayed on the display unit 151 and/or subsequent parts.

Through this process, when a user's palm or the like approaches the proximity sensor, the brightness of a broadcasting screen can be controlled to be dark to the extent that the contents of the screen cannot be recognized, or the broadcasting screen can be fully turned off. Further, while the brightness of a broadcasting screen is controlled, whether to output a sound signal can be decided according to setting.

Figure 11:
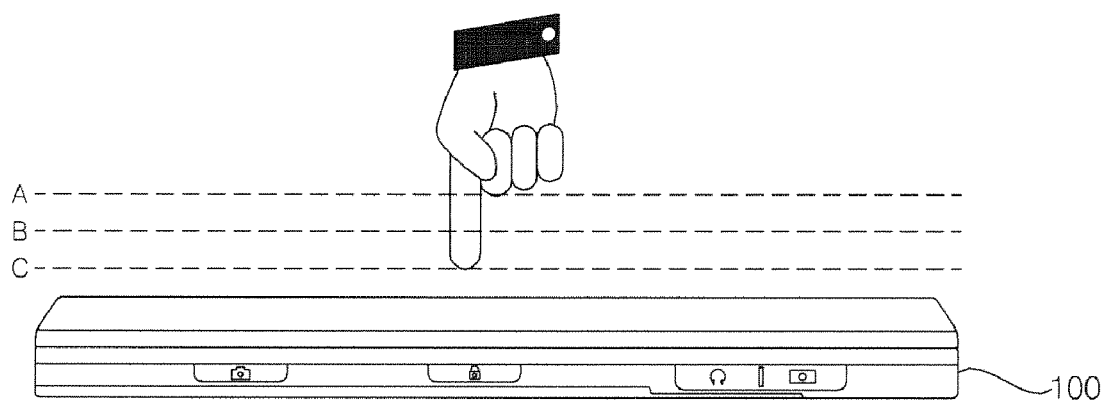
FIGS. 11 and 12 are diagrams illustrating the operation of a proximity sensor according to one embodiment of the present invention.
Figure 12:
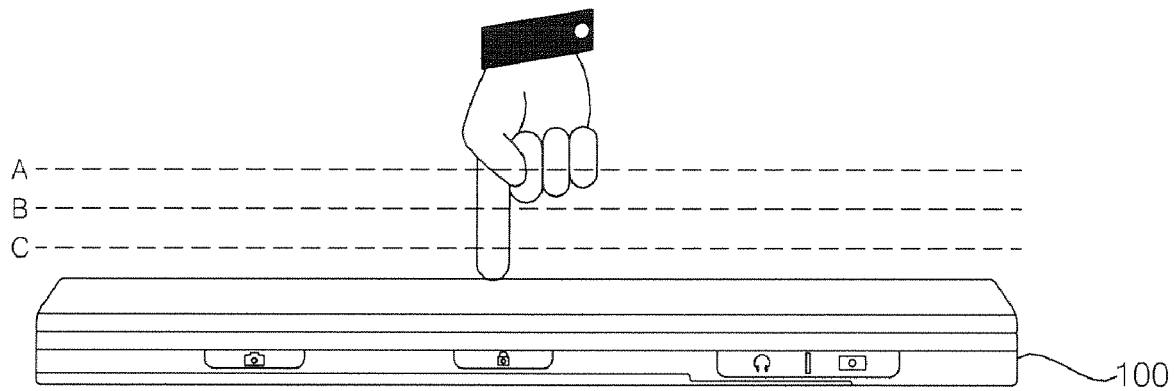

FIGS. 11 and 12 are diagrams describing the operation of a proximity sensor. Referring to FIG. 11, when a user's finger approaches the display unit, the proximity sensor 141 disposed in the first body, etc. senses such approach and outputs a proximity signal. Here, when a user's finger is placed at a location A, B or C, different proximity signals can be output, respectively.

In other words, generally, a distance where a detection signal, generated as an object approaches the proximity sensor, is output can be defined as a detection distance Sn. How close an object has approached proximity sensors having different detection distances can be found by comparing proximity signals output from the proximity sensors.

Further, a plurality of proximity sensors having different detection regions is disposed. In this state, if a case where proximity signals are output from all the proximity sensors and a case where a proximity signal is output from any one of the proximity sensors are compared with each other, a case where a user's finger approaches the proximity sensors and a case where a user's palm, having a wider detection area than that of the finger, approaches the proximity sensors can be identified.

Accordingly, the controller 180 can control the play speed of a moving image to be fast or slow according to the proximity degree of a user's finger. For example, if the user's finger becomes distant from the location A set as a critical location, any proximity signal may not be detected. Thus, the controller 180 can play the moving image at an original normal speed. Further, when a user's palm or the like approaches the proximity sensor, the brightness of a screen can be controlled.

FIG. 12 shows a case where a user's fingers approaches and then touches the display unit. When a user's finger touches the display unit 151, the controller 180 can determine whether there is a touch input, which region of the display unit 151 has been touched, and so on based on a touch signal received from the display unit 151 comprised of a touch screen.

FIGS. 13 to 27 are diagrams describing a control method of the mobile terminal in accordance with the present invention along with a screen displayed on the display unit.

Figure 13:
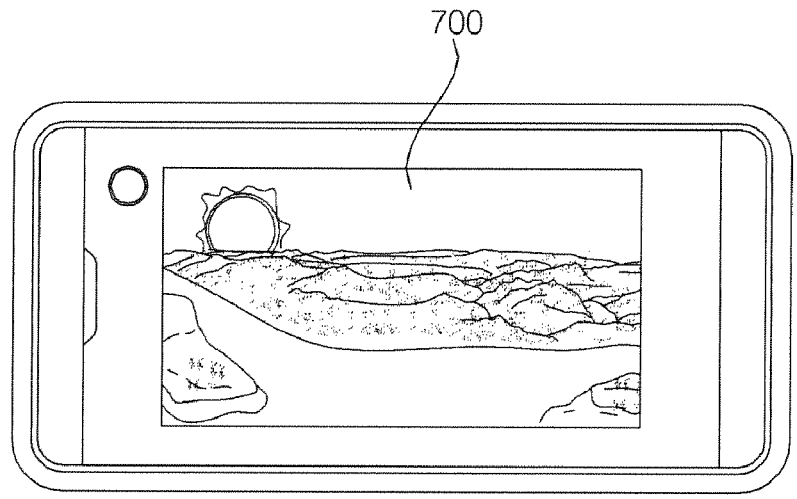
FIGS. 13 to 16 are diagrams illustrating a process of creating a capture image through a touch input in the control method of the mobile terminal in accordance with one embodiment of the present invention.
Figure 14:
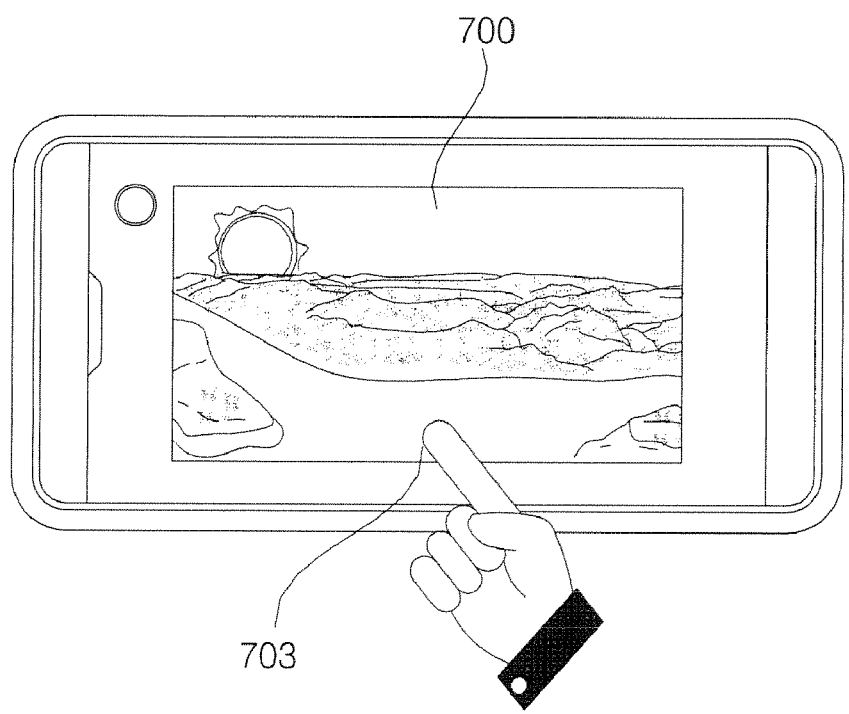

First, FIGS. 13 to 16 are diagrams describing a process of creating a capture image through a touch input in the control method of the mobile terminal in accordance with the present invention. FIG. 13 is a diagram showing an example of a moving image screen on which a moving image is being played. If, in a state where a moving image screen 700 is being displayed on the display unit 151, a user's finger or the like approaches the moving image screen 700, the play speed of the moving image can be controlled to be slow or fast. Further, when a user's finger or the like touches the moving image screen 700 and therefore a touch input 703 exists, as shown in FIG. 14, a touched screen can be captured to thereby create a capture image.

A user command pertinent to screen control can be input through the user input unit 130, or can be input by selecting a menu icon, which is related to screen control displayed on the moving image screen 700. Further, when a left, right, up or down boundary region of the moving image screen 700 is touched, a menu pertinent to screen control may be displayed. When the center of the moving image screen 700 is touched, a screen may be overlapped.

Figure 15:
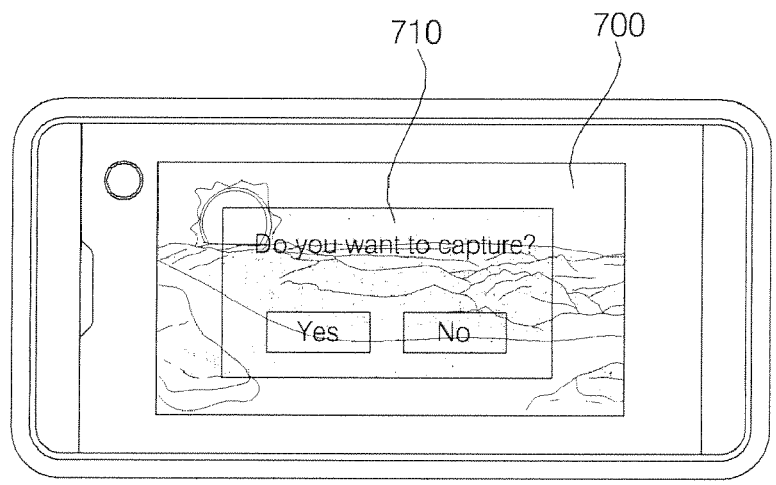

When the moving image screen 700 is touched, a touched screen may not be captured immediately, but instead the play of a moving image is paused and a capture selection menu 710 for selecting capturing may be then displayed, as shown in FIG. 15. If 'Yes' is selected in the capture selection menu 710, the touched screen is captured to thereby create a capture image. However, if 'No' is selected in the capture selection menu 710, the paused moving image is played again without screen capturing.

Figure 16:
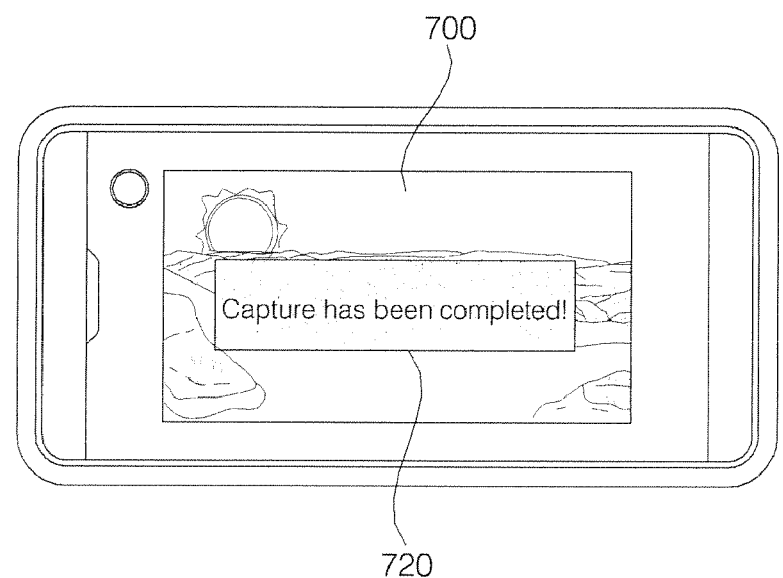

FIG. 16 shows an example in which a capture completion message 720, informing a user that capturing has been completed, is displayed. The capture completion message 720 may be displayed in the form of a pop-up window. The capture completion message 720 may be displayed for a specific time period and then automatically disappear, and a moving image may be played continuously. Further, only when the capture completion message 720 is touched, a moving image may be played continuously as the capture completion message 720 disappears.

Figure 17:
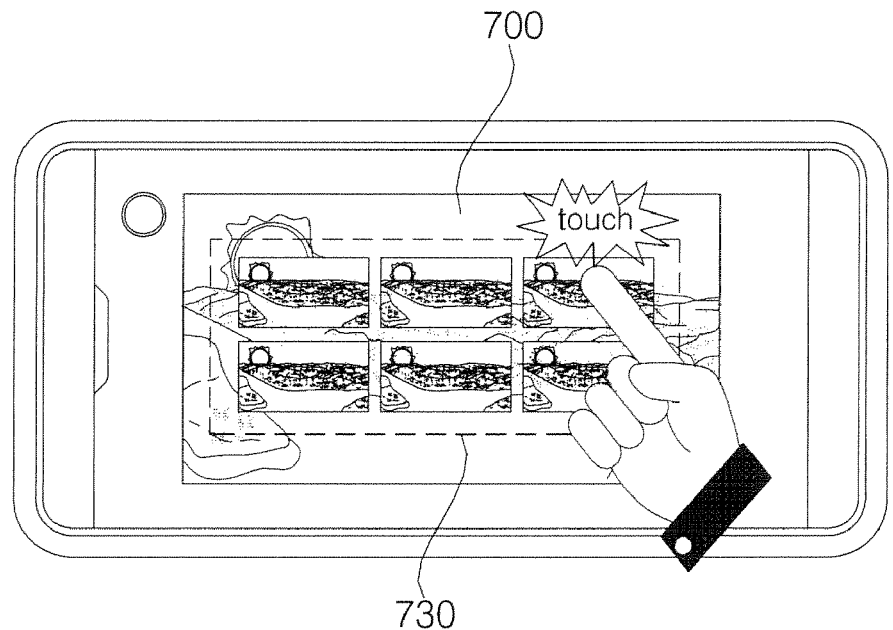
FIG. 17 is a diagram illustrating a process of displaying several frame screens and capturing a screen upon screen touch in the control method of the mobile terminal in accordance with one embodiment of the present invention.

FIG. 17 is a diagram to which reference is made in order to describe a process of displaying several frame screens and capturing a screen upon screen touch in the control method of the mobile terminal in accordance with the present invention. In this case, when the moving image screen 700 is touched, a touched screen is not captured immediately, but a screen selection menu 730 in which a specific number of frame screens are displayed in thumbnail form or the like is displayed on the moving image screen 700.

In other words, a specific number of frame screens previous and subsequent to the touched screen, that is, a current frame screen, can be displayed on the screen selection menu 730, and any one of the frame screens can be touched and captured. Here, the number of frame screens displayed on the screen selection menu 730 may be changed according to a user command or the like. Alternatively, when any one of the frame screens is selected in the screen selection menu 730, the selected screen may be enlarged and displayed, and a menu for selecting capturing may be displayed in the form of a pop-up window.

Figure 18:
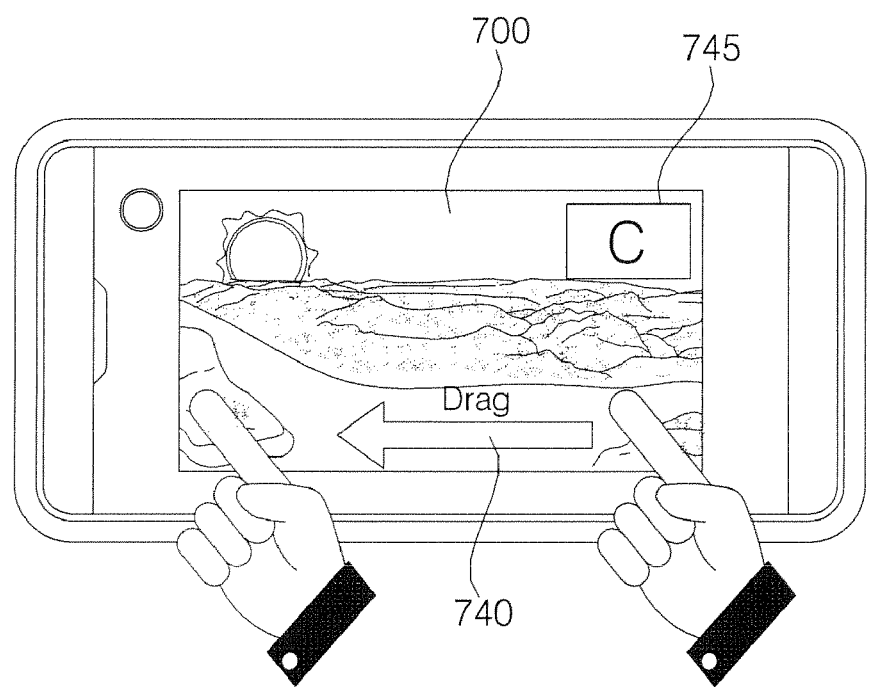
FIGS. 18 to 20 are diagrams illustrating an operational process when a touch signal with directivity is input in the control method of the mobile terminal in accordance with one embodiment of the present invention.
Figure 19:
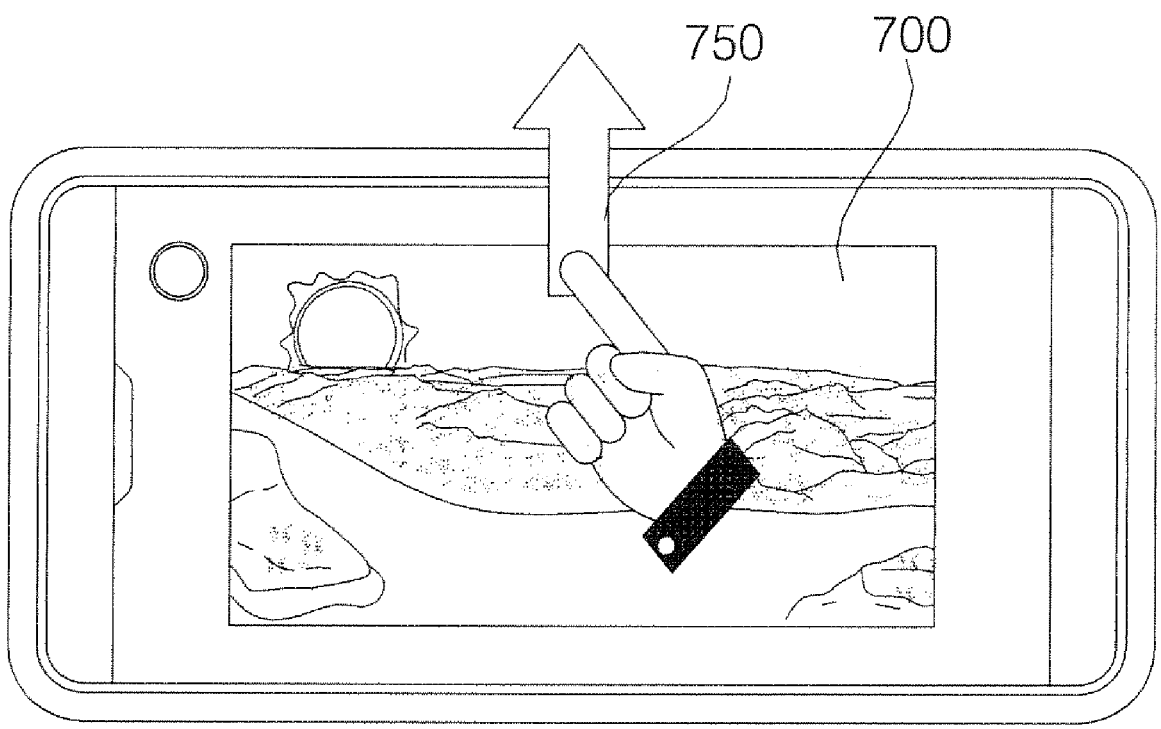
Figure 20:
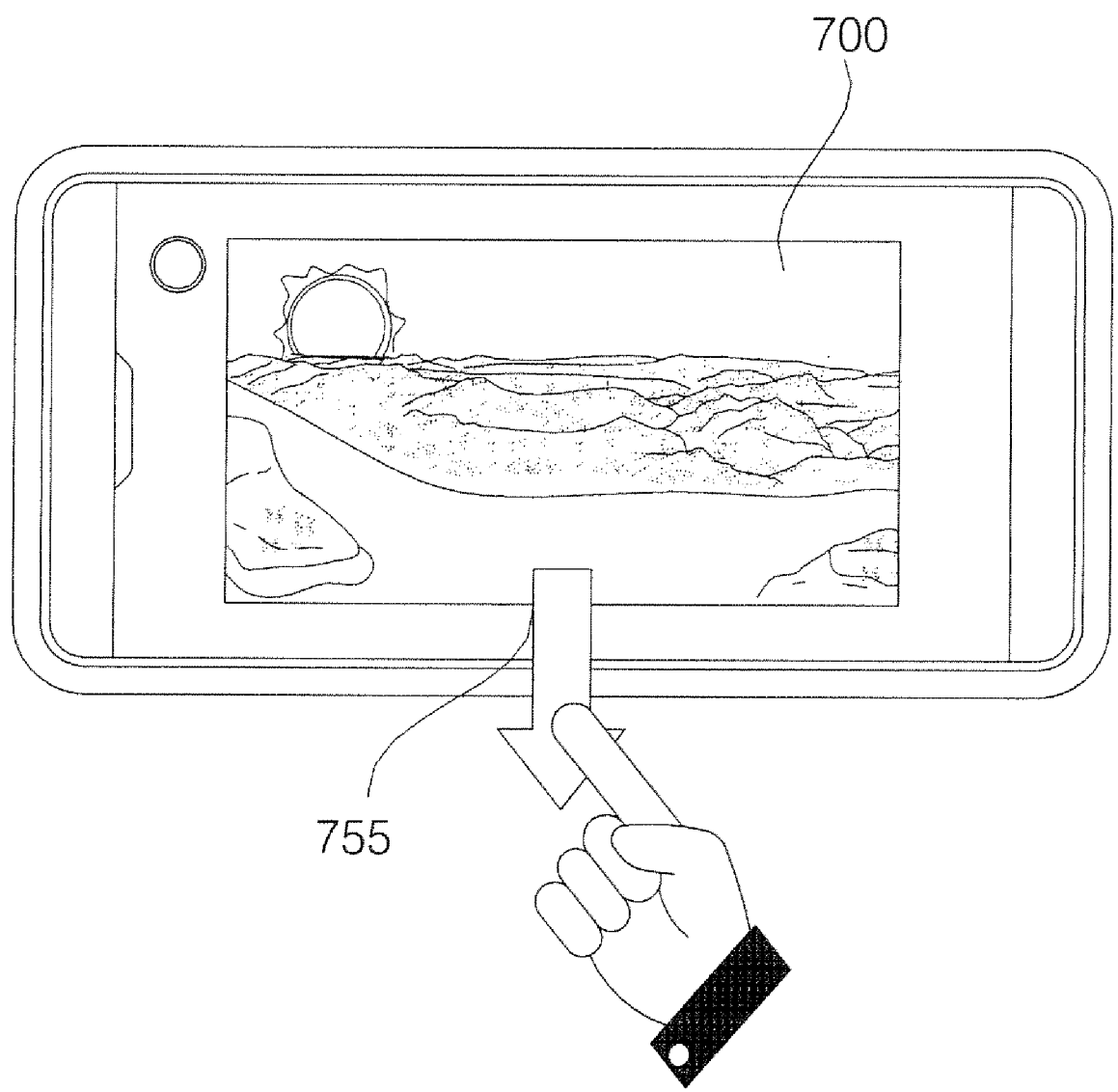

FIGS. 18 to 20 are diagrams describing an operational process when a touch signal with directivity is input in the control method of the mobile terminal in accordance with the present invention. First, FIG. 18 shows an example in which a touch and drag input 740 exists in a left direction in the moving image screen 700. When the touch and drag input 740 exists as described above, a frame screen before a screen that is now being displayed can be displayed. When there is a touch and drag input in a right direction, a frame screen after a current frame screen can be displayed. At the same time, the current screen can be captured by touching an icon 745 'C' displayed on the moving image screen 700.

FIG. 19 shows an example in which a touch and drag input 750 exists in an upward direction in the moving image screen. FIG. 20 shows an example in which a touch and drag input 755 exists in a downward direction in the moving image screen. When there is the drag input 750 or 755 with upward or downward directivity in the moving image screen 700 as described above, a communication menu or other setting menus may be driven. Further, when a drag input with left or right directivity exists, a previous frame screen or a next frame screen can be displayed.

Figure 21:
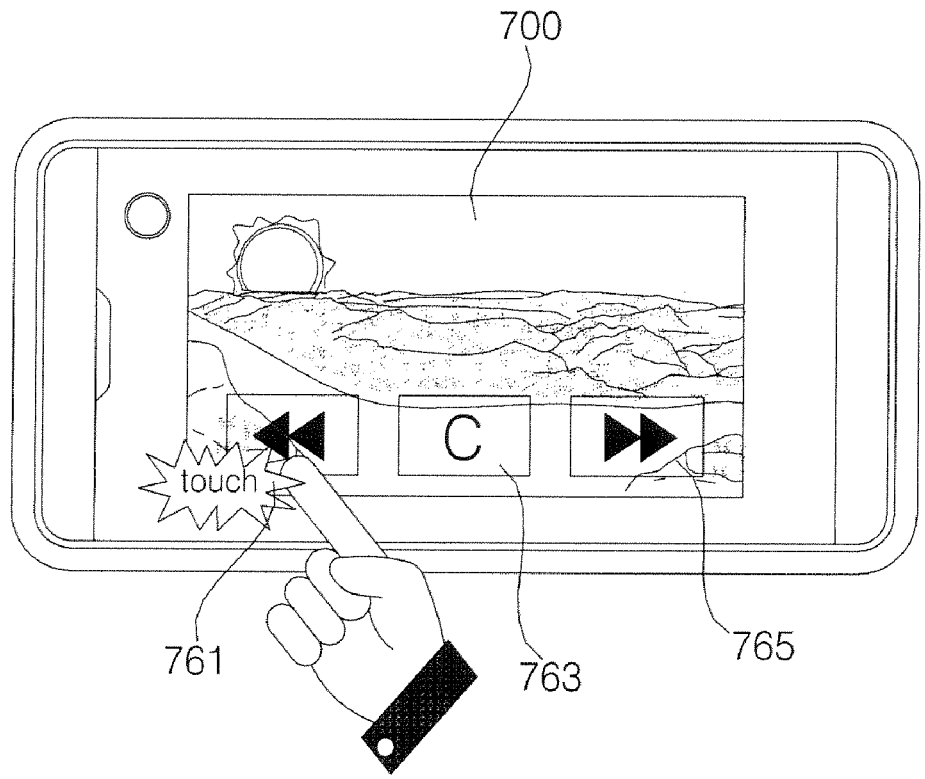
FIGS. 21 to 23 are diagrams illustrating a case where screen capturing is performed using a menu icon in the control method of the mobile terminal in accordance with one embodiment of the present invention.
Figure 22:
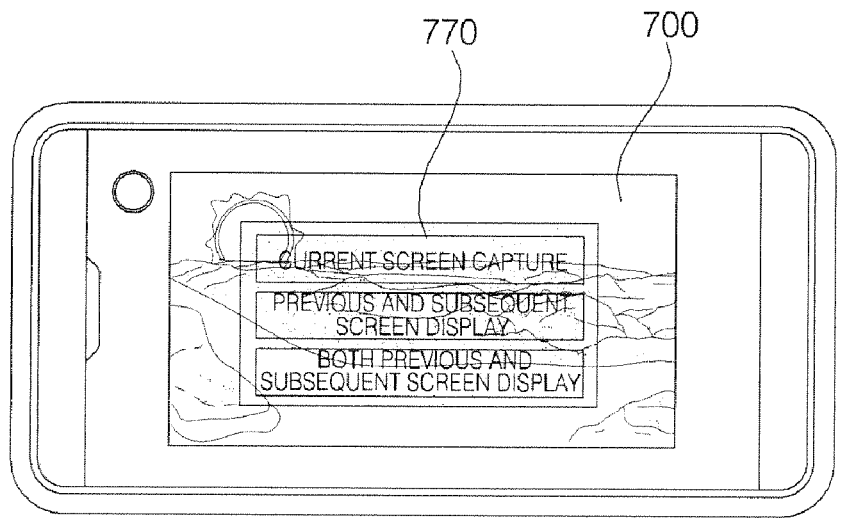
Figure 23:
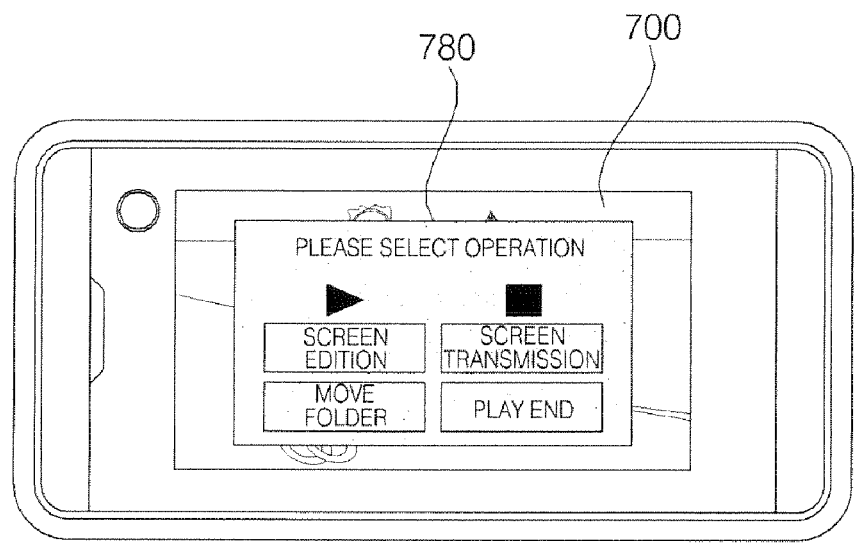

FIGS. 21 to 23 are diagrams describing a case where screen capturing is performed using a menu icon in the control method of the mobile terminal in accordance with the present invention.

Referring to FIG. 21, instead of displaying a previous or next frame screen of a current screen through the drag input of the left and right directions, indicator icons 761, 763, and 765 can be displayed when a moving image screen is paused, and front and rear screens can be searched and captured by touching the screen. In other words, a screen previous to a current screen or a desired one of next screens can be searched and displayed by touching the icon 761 for selecting a previous screen or the icon 765 for selecting a next screen. A touched screen can be captured by touching the C icon 763.

Further, when a screen is touched, a screen capture menu 770 can be displayed, as shown in FIG. 22. When a menu item 'Current Screen Capture' is selected in the screen capture menu 770, a frame screen displayed on a current screen is captured. When a menu item 'Previous and Subsequent Screen Display' is selected, a preset number of screens of previous and subsequent screens of a current screen can be displayed. Furthermore, when a menu item 'Both Previous and Subsequent Screen Display' is selected, several previous and subsequent frame screens on the basis of a current screen can be all captured and stored. At this time, the number of frame screens that are captured and stored may be changed according to a user's selection or the like.

As shown in FIG. 23, a pop-up window, informing that capturing has been completed, can be temporarily displayed, or after a capture image is created, an operation selection menu 780 in which a user can display subsequent operations can be displayed. Here, when a menu item 'Screen Edition' is selected in the operation selection menu 780, a menu for editing a capture image is provided. When a menu item 'Screen Transmission' is selected in the operation selection menu 780, a menu for transmitting a capture image to a selected counterpart device or an external device is displayed. When a menu item 'Move Folder' is selected, a menu is moved to a folder where a capture image is stored and a list of stored capture images is displayed. When a menu item 'Play End' is selected, the play of a moving image is finished, and an idle screen, a main menu screen, and so on are displayed. The menu items included in the operation selection menu 780 may be selected according to a user's command.

FIGS. 24 to 27 are diagrams to which reference is made in order to describe a case where the brightness of a screen is controlled according to a proximity signal in the control method of the mobile terminal in accordance with the present invention.

Figure 24:
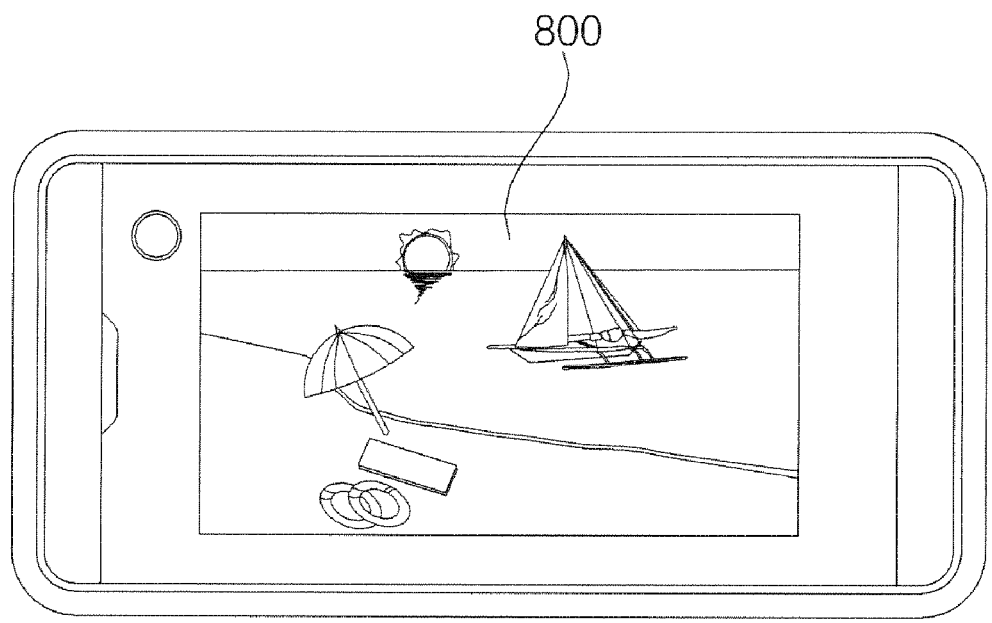
FIGS. 24 to 27 are diagrams illustrating a case where the brightness of a screen is controlled according to a proximity signal in the control method of the mobile terminal in accordance with one embodiment of the present invention.
Figure 25:
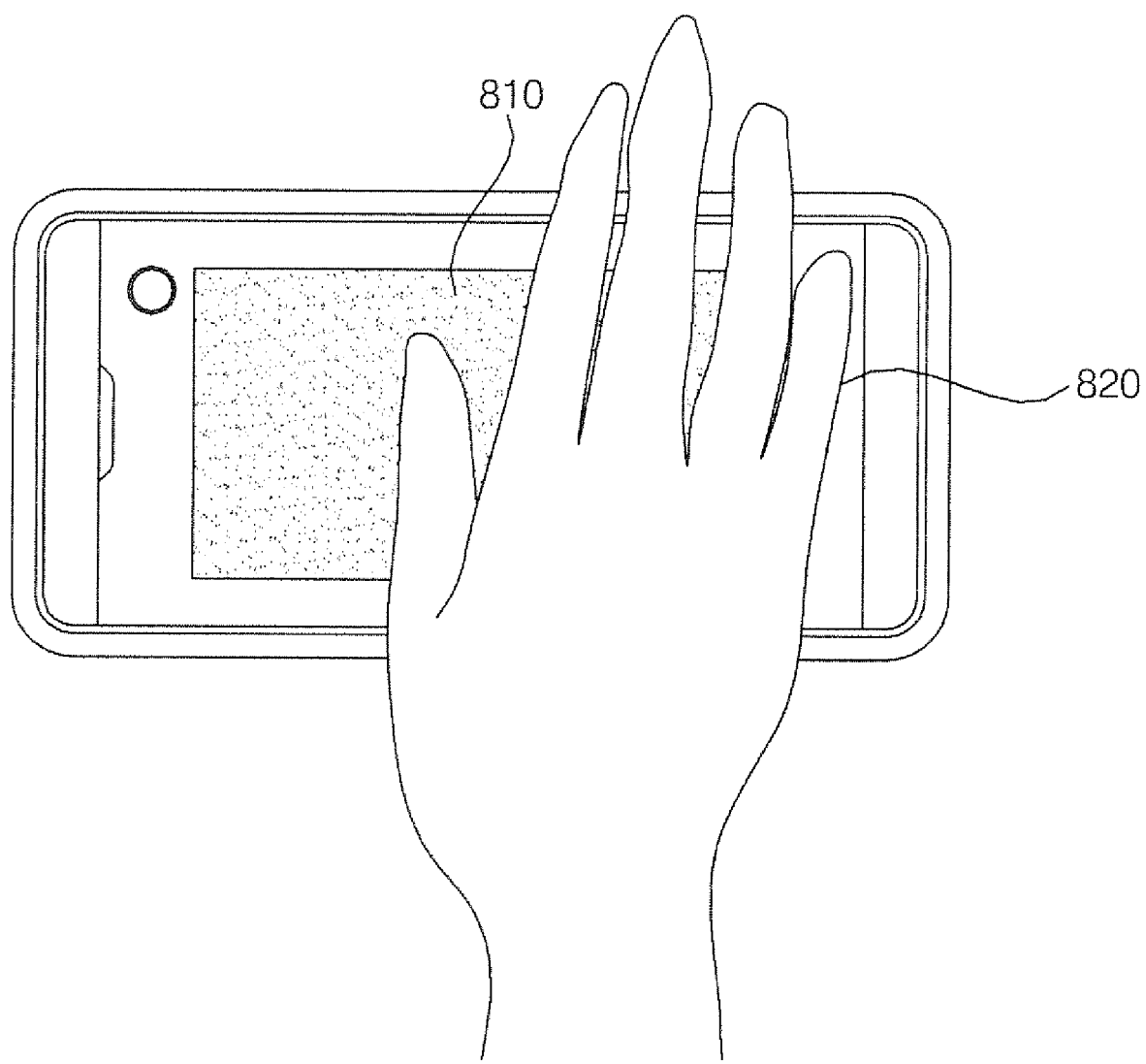

FIG. 24 shows an example of a broadcasting screen on which a selected broadcasting signal is decoded and displayed. If, in a state where a broadcasting screen 800 is being displayed, when a user's palm 820 for example approaches the broadcasting screen 800, a screen 810 (shown in FIG. 25) in which broadcasting contents cannot be recognized or which is fully turned off is displayed. A screen brightness of a degree that broadcasting contents cannot be recognized can be set previously. A fully turned-off screen 810 can be implemented by turning off the backlight of the display unit 151.

Figure 26:
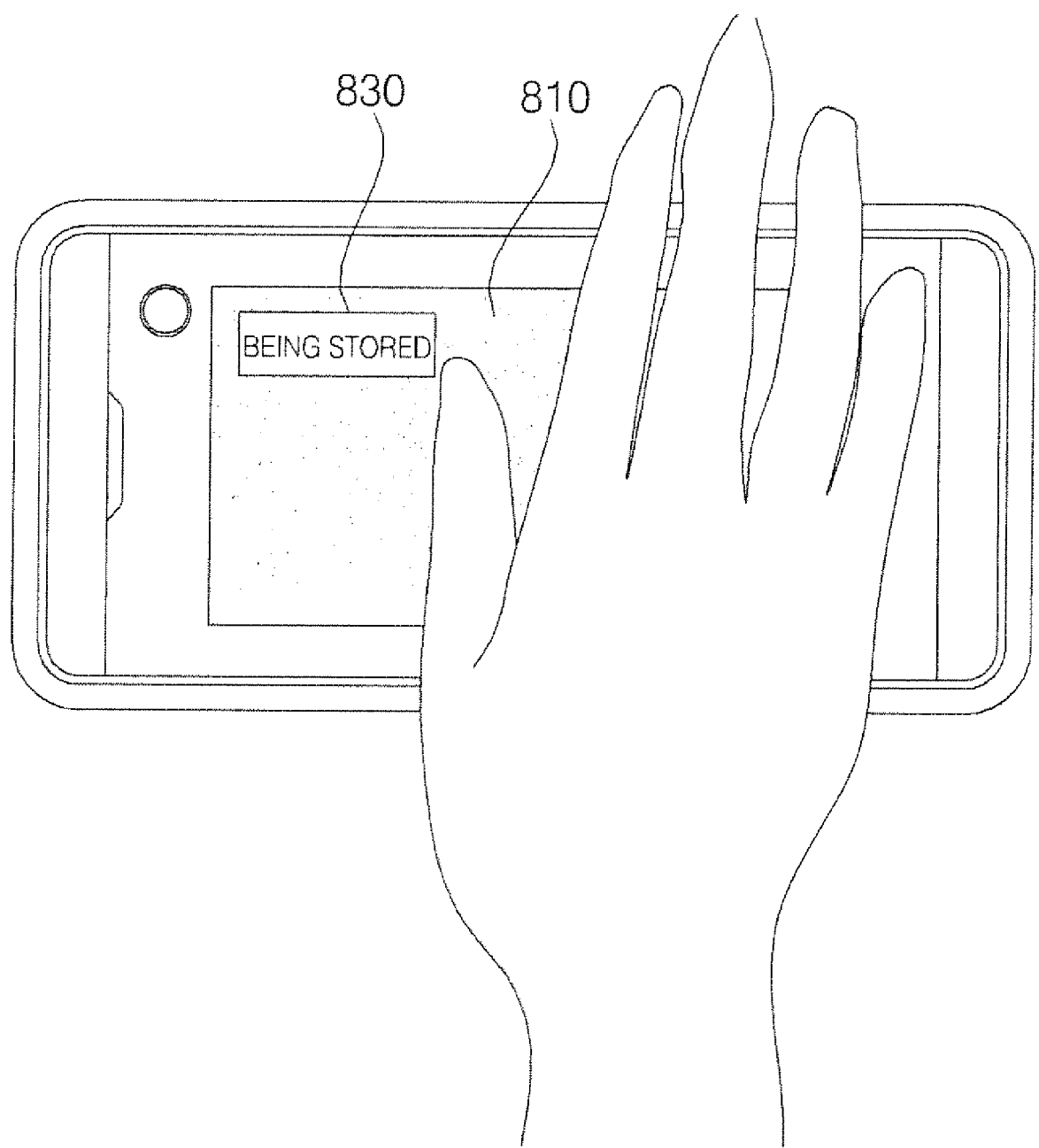

Here, when a broadcasting screen is being stored, an icon 830, informing that the broadcasting screen is being stored, can be displayed as shown in FIG. 26. The fact that the broadcasting screen is being stored can be also informed through a specific key, flickering of a LED or the like. When controlling the brightness of a broadcasting screen, whether or not to store the broadcasting screen can be set previously.

Figure 27:
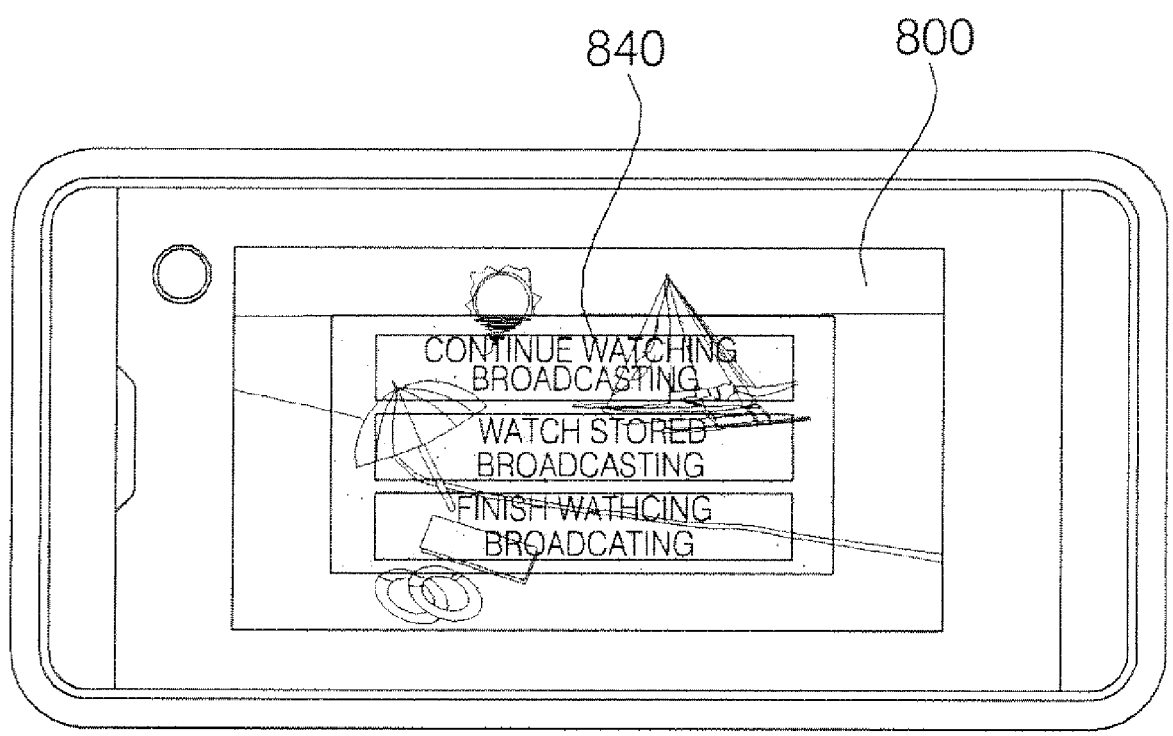

If a user's palm disappears from the screen, a selection menu 840 for selecting a subsequent operation can be displayed when a broadcasting screen becomes an original brightness, as shown in FIG. 27. In this case, the selection menu 840 may also be displayed in a state where a broadcasting screen is being turned off. When a menu item 'Continue Watching Broadcasting' is selected in the selection menu 840, an original selected broadcasting signal is decoded and a broadcasting screen is displayed. When a menu item 'Watch Stored Broadcasting' is selected in the selection menu 840, a stored broadcasting signal is played and a broadcasting screen is displayed. Further, when a menu item 'Finish Watching Broadcasting' is selected in the selection menu 840, broadcasting watching is finished and an idle screen, a main menu, and so on are displayed.

In addition, if, in a state where a moving image screen as well as a broadcasting screen is played or other screens are displayed, when a user's palm approaches the display unit, the brightness of a displayed screen can be controlled. When a touch signal is input again, the play of a moving image may be finished or other operations may be performed.

Further, the mobile terminal and the control method thereof in accordance with the present invention are not limited to the constructions and methods described in connection with the above embodiments. All or part of the above embodiments may be selectively combined in order to modify the embodiments in various ways.

Meanwhile, the present invention may be implemented in a recording medium in which a code readable by a processor included in a mobile terminal, such as a mobile station modem (MSM) is implemented. The processor-readable recording media may include all kinds of recording devices in which data, which can be readable by a processor, is stored. For example, the processor-readable recording media may include ROM, RAM, CD-ROM, magnetic tapes, floppy disks, optical data storages, and so on, and also include the form of carrier waves, such as transmission over the Internet. Further, the processor-readable recording media may be distributed into computer systems connected over a network, and a processor-readable code may be stored and executed in a distributed manner.

As described above, according to the present invention, the play speed of a moving image displayed on the display unit can be controlled according to a proximity signal detected by the proximity sensor. A variety of operations, such as screen capturing, can be controlled in conjunction with a touch input. Accordingly, a user can control the operation of a mobile terminal conveniently through an operation of approaching his finger to a screen and touching the screen, instead of selecting menus pertinent to screen control and executing the selected menus.

While the invention has been described in connection with what is presently considered to be practical exemplary embodiments, it is to be understood that the invention is not limited to the disclosed embodiments, but, on the contrary, is intended to cover various modifications and equivalent arrangements included within the spirit and scope of the appended claims.

What is claimed is:

1. A mobile terminal, comprising:
    a touchscreen configured for displaying a moving image on a screen on which a moving image is displayed;
    a proximity sensor configured for sensing an object in near-proximity to the touchscreen; and
    a controller configured for:
        controlling a play speed of the moving image to slow when the object is in near-proximity to the touchscreen;
        returning the play speed of the moving image from slow to an original play speed when the object is not detected by the proximity sensor;
        pausing a playback of the moving image and displaying a paused screen on the touchscreen in response to the object contacting a central region of the screen, the paused screen including a plurality of image frames comprising an image frame contacted by the object, a predetermined number of image frames previous to the contacted image frame and a predetermined number of image frames subsequent to the contacted image frame;
        capturing an image frame of the plurality of displayed image frames of the paused screen when a first touch input in a first direction is received via the paused screen;
        capturing an image frame of the plurality of displayed image frames of the paused screen and switching an operation mode of the mobile terminal from a moving image playback mode to a communication mode for transmitting the captured image frame when a second touch input in a second direction is received via the paused screen; and
        controlling the touchscreen to display a screen control menu when the object contacts a boundary region of the screen or a portion of the touchscreen outside the screen.

2. The mobile terminal of claim 1, wherein the controller is further configured for incrementally moving the image based on a movement of the object along the touchscreen while contacting the touchscreen.

3. The mobile terminal of claim 1, wherein the controller is further configured for capturing an image frame of the moving image based on a movement of the object along the touchscreen while contacting the touchscreen.

4. The mobile terminal of claim 1, wherein the controller is further configured for capturing an image frame of the moving image and facilitating transmission of the captured image frame based on a movement of the object along the touchscreen while contacting the touchscreen.

5. The mobile terminal of claim 1, wherein the controller is further configured for:
    capturing an image frame of the paused screen and moving the captured image to a storage folder when a third touch input in a third direction is received via the paused screen; and
    displaying an image frame before the paused screen or after the paused screen when a fourth touch input in a fourth direction is received via the paused screen.

6. A mobile terminal, comprising:
    a touchscreen configured for displaying a moving image on a screen on which a moving image is displayed;

a proximity sensor configured for sensing an object in near-proximity to the touchscreen; and a controller configured for:

controlling a play speed of the moving image to slow when a first object having a size smaller than a reference size is in near-proximity to the touchscreen;

returning the play speed of the moving image from slow to an original play speed when the object is not detected by the proximity sensor;

controlling a brightness of the screen when a second object having a size larger than the reference size is in near proximity to the touchscreen and returning the brightness of the screen to an original brightness level when the object is not detected by the proximity sensor; and controlling the touchscreen to display a screen capture menu in response to the first object contacting the touchscreen, wherein the screen capture menu comprises an option for capturing a current image frame of the screen, an option for displaying image frames previous and subsequent to the current image frame or an option for capturing image frames previous and subsequent to the current image frame.

7. The mobile terminal of claim 6, wherein:

the controller is further configured for controlling the touchscreen to display a selection menu based on a state of the second object in near-proximity to the touchscreen; and the selection menu comprises a function for continuing to watch a current broadcast, a function for watching a stored broadcast, or a function for ending broadcast watching.

8. The mobile terminal of claim 6, wherein the screen capture menu is displayed on the touchscreen as a pop-up window.

9. A method for controlling a mobile terminal, the method comprising:

displaying a moving image on a screen displayed on a touchscreen of the mobile terminal;

sensing an object in near-proximity to the touchscreen;

controlling a play speed of the moving image to slow when the object is in near-proximity to the touchscreen;

controlling movement of the moving image to stop when the object contacts a central region of the screen;

returning the play speed of the moving image from slow or stop to an original play speed when the object is not detected by the proximity sensor;

pausing a playback of the moving image and displaying a paused screen on the touchscreen in response ti the object contacting a central region of the screen, the paused screen including a plurality of the image frames comprising an image frame contacted by the object, a predetermined number of image frames previous to the contacted image frame and a predetermined number of image frames subsequent to the contacted image frame;

capturing an image frame of the plurality of displayed image frames of the paused screen when a first touch input in a first direction is received via the paused screen;

capturing an image frame of the paused screen when a first touch input in a first direction is received via the paused screen and switching an operation mode of the mobile terminal from a moving image playback mode to a communication mode for transmitting the captured image frame when a second touch input in a second direction is received via the paused screen; and controlling the touchscreen to display a screen control menu when the object contacts a boundary region of the screen or a portion of the touchscreen outside the screen.

10. The method of claim 9, further comprising controlling the touchscreen to incrementally move the image based on a movement of the object along the touchscreen while contacting the touchscreen.

11. The method of claim 9, further comprising capturing an image frame of the moving image based on a movement of the object along the touchscreen while contacting the touchscreen.

12. The method of claim 9, further comprising capturing an image frame of the moving image and facilitating transmission of the captured image frame based on a movement of the object along the touchscreen while contacting the touchscreen.

13. The method of claim 9, wherein displaying a the paused screen further comprises:

capturing an image frame of the paused screen and moving the captured image to a storage folder when a third touch input in a third direction is received via the paused screen; and displaying an image frame before the paused screen or after the paused screen when a fourth touch input in a fourth direction is received via the paused screen.

14. A method of controlling a mobile terminal, the method comprising:

displaying a moving image on a screen displayed on a touchscreen of the mobile terminal;

sensing an object in near-proximity to the touchscreen;

controlling a play speed of the moving image to slow when a first object having a size smaller than a reference size is in near-proximity to the touchscreen;

returning the play speed of the moving image from slow to an original play speed when the object is not detected by the proximity sensor;

controlling a brightness level of the screen when a second object having a size larger than the reference size is in near proximity to the touchscreen;

returning the brightness of the screen to an original brightness level when the object is not detected by the proximity sensor; and controlling the touchscreen to display a screen capture menu in response to the first object contacting the touchscreen, wherein the screen capture menu comprises a function for capturing a current image frame, a function for displaying a plurality of image frames of the moving image, or a function for capturing a plurality of image frames of the moving image.

15. The method of claim 14, further comprising:

controlling the touchscreen to display a selection menu based on a state of the second object in near-proximity to the touchscreen, wherein the selection menu comprises a function for continuing to watch a current broadcast, a function for watching a stored broadcast, or a function for ending broadcast watching.

16. The method of claim 14, wherein the screen capture menu is displayed on the touchscreen as a pop-up window.

* * * * *